(12) United States Patent
Shimizu et al.

(10) Patent No.: US 12,142,616 B2
(45) Date of Patent: Nov. 12, 2024

(54) LIGHT DETECTOR, LIGHT DETECTION SYSTEM, LIDAR DEVICE, AND MOBILE BODY

(71) Applicant: KABUSHIKI KAISHA TOSHIBA, Tokyo (JP)

(72) Inventors: Mariko Shimizu, Setagaya Tokyo (JP); Ikuo Fujiwara, Yokohama Kanagawa (JP); Keita Sasaki, Yokohama Kanagawa (JP); Kazuaki Okamoto, Yokohama Kanagawa (JP); Honam Kwon, Kawasaki Kanagawa (JP); Kazuhiro Suzuki, Meguro Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 448 days.

(21) Appl. No.: 17/680,184

(22) Filed: Feb. 24, 2022

(65) Prior Publication Data
US 2022/0352219 A1    Nov. 3, 2022

(30) Foreign Application Priority Data

Apr. 28, 2021 (JP) .................................. 2021-075746

(51) Int. Cl.
*H01L 27/146*    (2006.01)
*G01S 7/481*    (2006.01)

(52) U.S. Cl.
CPC ...... *H01L 27/14603* (2013.01); *G01S 7/4816* (2013.01); *H01L 27/14636* (2013.01);
(Continued)

(58) Field of Classification Search
CPC ......... H01L 27/14603; H01L 27/14636; H01L 27/14649; H01L 27/14685; H01L 27/1463;
(Continued)

(56) References Cited

U.S. PATENT DOCUMENTS

2019/0206910 A1* 7/2019 Suzuki .............. H01L 27/14625
2019/0296074 A1 9/2019 Kokubun et al.
(Continued)

FOREIGN PATENT DOCUMENTS

EP     2 040 308 A1    3/2009
JP     2019-114728 A    7/2019
(Continued)

*Primary Examiner* — Tony Ko
(74) *Attorney, Agent, or Firm* — Finnegan, Henderson, Farabow, Garrett & Dunner, LLP

(57) ABSTRACT

According to one embodiment, a light detector includes a plurality of elements, a plurality of separation parts, a fourth semiconductor region, a fifth semiconductor region, a first interconnect, a first quenching part, and a second interconnect. The elements are located in a cell region and arranged. Each of the elements includes first, second, and third semiconductor regions. The second semiconductor region is located on the first semiconductor region. The third semiconductor region is located on the second semiconductor region. The separation parts are located respectively around the elements. The fourth semiconductor region is located around each of the separation parts. The fifth semiconductor region is located on the fourth semiconductor region. The first interconnect is electrically connected to the third semiconductor regions. The first quenching part is electrically connected to the first interconnect. The second interconnect is electrically connected to the fifth semiconductor region.

16 Claims, 25 Drawing Sheets

(52) U.S. Cl.
CPC .. *H01L 27/14649* (2013.01); *H01L 27/14685* (2013.01); *H01L 27/1463* (2013.01)

(58) Field of Classification Search
CPC . H01L 27/14643; G01S 7/4816; G01S 7/4863
See application file for complete search history.

(56) References Cited

U.S. PATENT DOCUMENTS

| | | | |
|---|---|---|---|
| 2021/0132230 A1 | 5/2021 | Fujiwara et al. | |
| 2021/0183930 A1 | 6/2021 | Takatsuka | |
| 2021/0293937 A1* | 9/2021 | Fujiwara | H01L 27/14609 |
| 2022/0181363 A1 | 6/2022 | Matsumoto et al. | |

FOREIGN PATENT DOCUMENTS

| | | |
|---|---|---|
| JP | 2019-165181 A | 9/2019 |
| JP | 2021-72347 A | 5/2021 |
| JP | 2021-148640 A | 9/2021 |
| WO | WO 2020/202888 | 10/2020 |

* cited by examiner

LIGHT DETECTOR, LIGHT DETECTION SYSTEM, LIDAR DEVICE, AND MOBILE BODY

CROSS-REFERENCE TO RELATED APPLICATIONS

This application is based upon and claims the benefit of priority from Japanese Patent Application No. 2021-075746, filed on Apr. 28, 2021; the entire contents of which are incorporated herein by reference.

FIELD

Embodiments described herein relate generally to a light detector, a light detection system, a LIDAR device, and a mobile body.

BACKGROUND

There is a light detector detecting light incident on a semiconductor region. It is required for the light detector to improve reliability.

DETAILED DESCRIPTION

Figure 1:
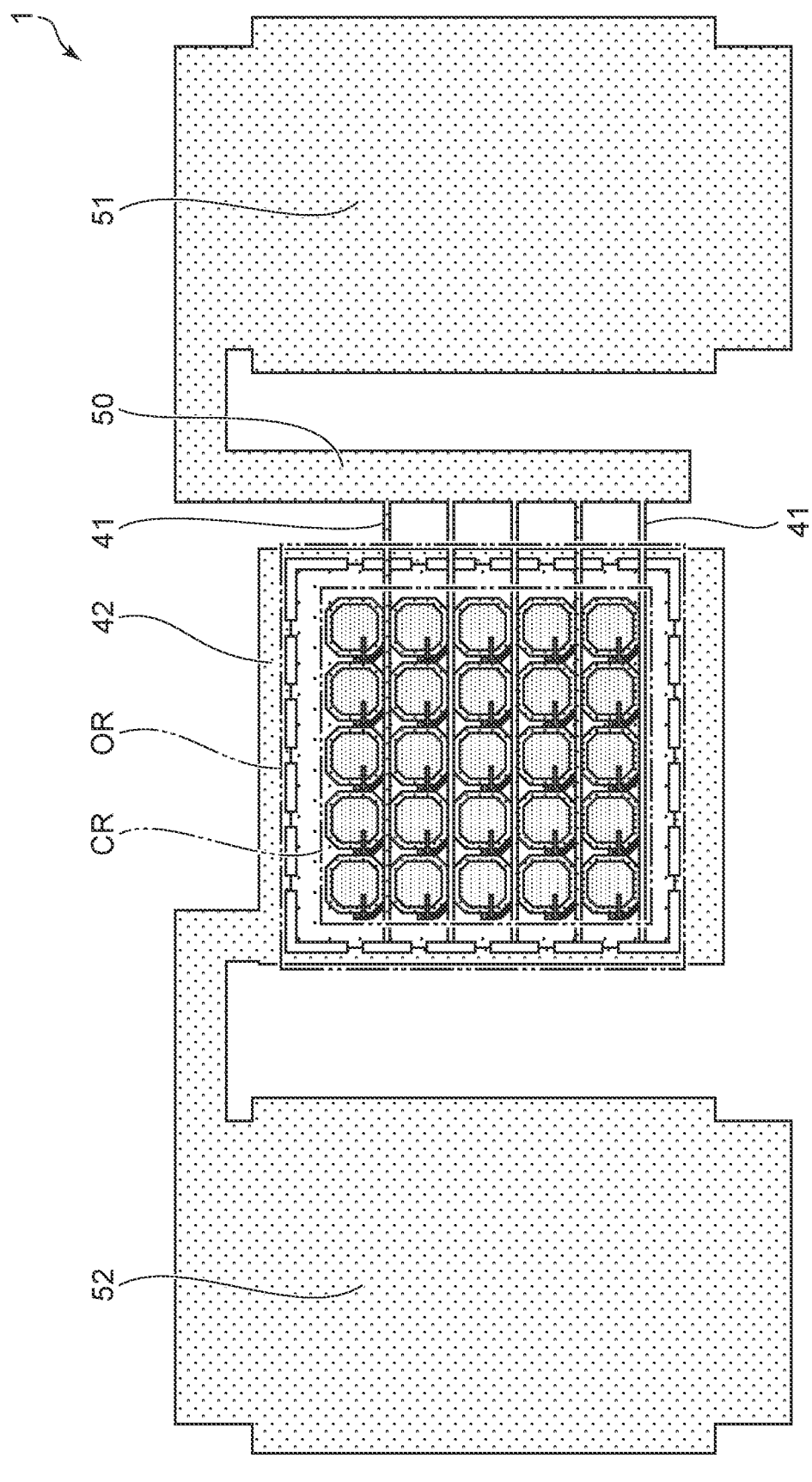
FIG. 1 is a schematic plan view illustrating a light detector according to a first embodiment.

According to one embodiment, a light detector includes a plurality of elements, a plurality of separation parts, a fourth semiconductor region of a first conductivity type, a fifth semiconductor region of a second conductivity type, a first interconnect, a first quenching part, and a second interconnect. The elements are located in a cell region and arranged along a first direction and a second direction. The second direction crosses the first direction. Each of the elements includes a first semiconductor region of the first conductivity type, a second semiconductor region of the first conductivity, and a third semiconductor region of the second conductivity type. The second semiconductor region is located on the first semiconductor region, and includes a higher first-conductivity-type impurity concentration than the first semiconductor region. The third semiconductor region is located on the second semiconductor region. The separation parts are located respectively around the elements in a first plane parallel to the first and second directions. The fourth semiconductor region is located around each of the separation parts in the first plane. The fifth semiconductor region is located on the fourth semiconductor region. The first interconnect is electrically connected to at least a portion of the third semiconductor regions. The first quenching part is electrically connected to the first interconnect. The second interconnect is electrically connected to the fifth semiconductor region at a periphery of the cell region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

First Embodiment

Figure 2:
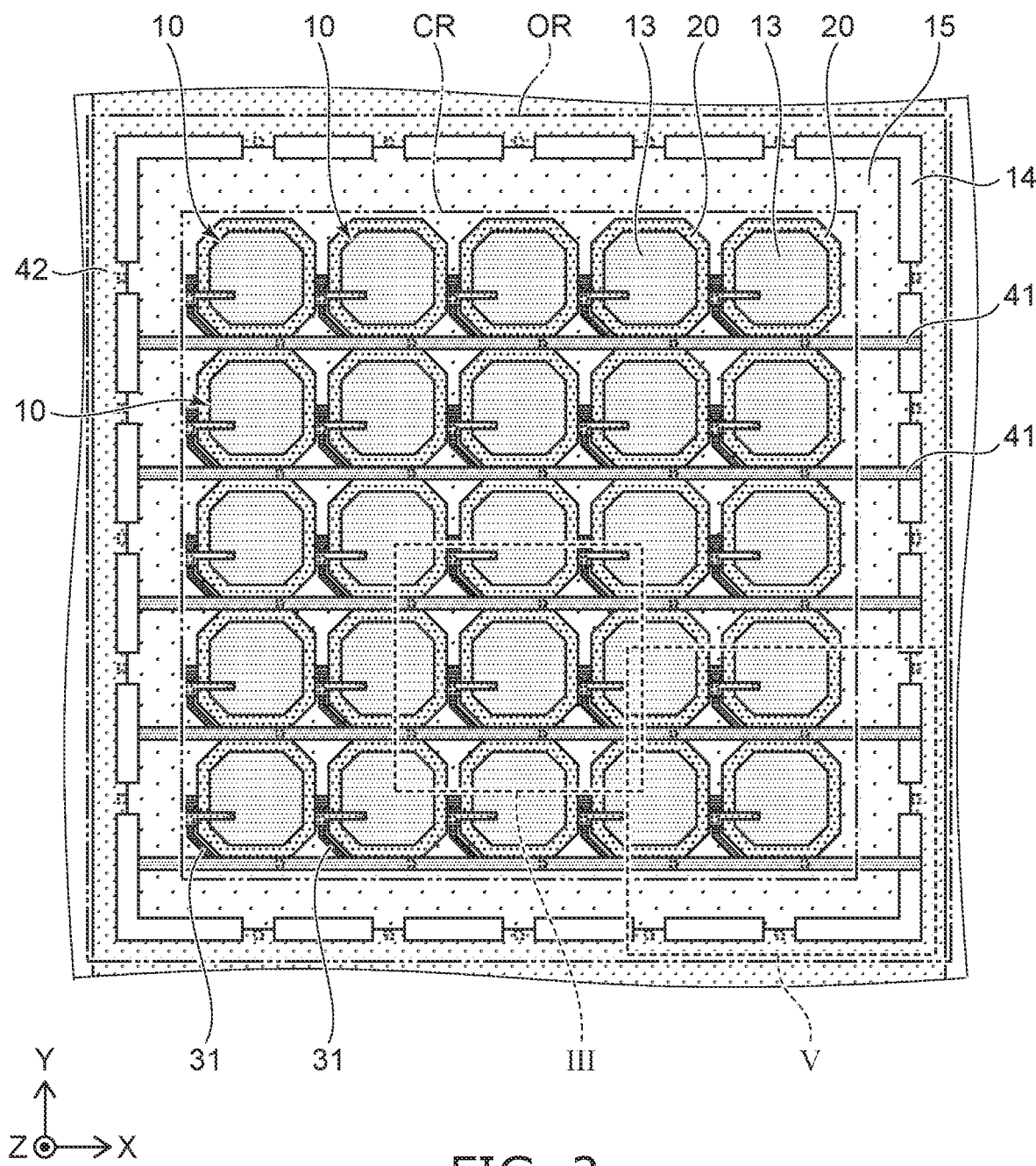
FIG. 2 is a schematic plan view enlarging a portion of FIG. 1.
Figure 3:
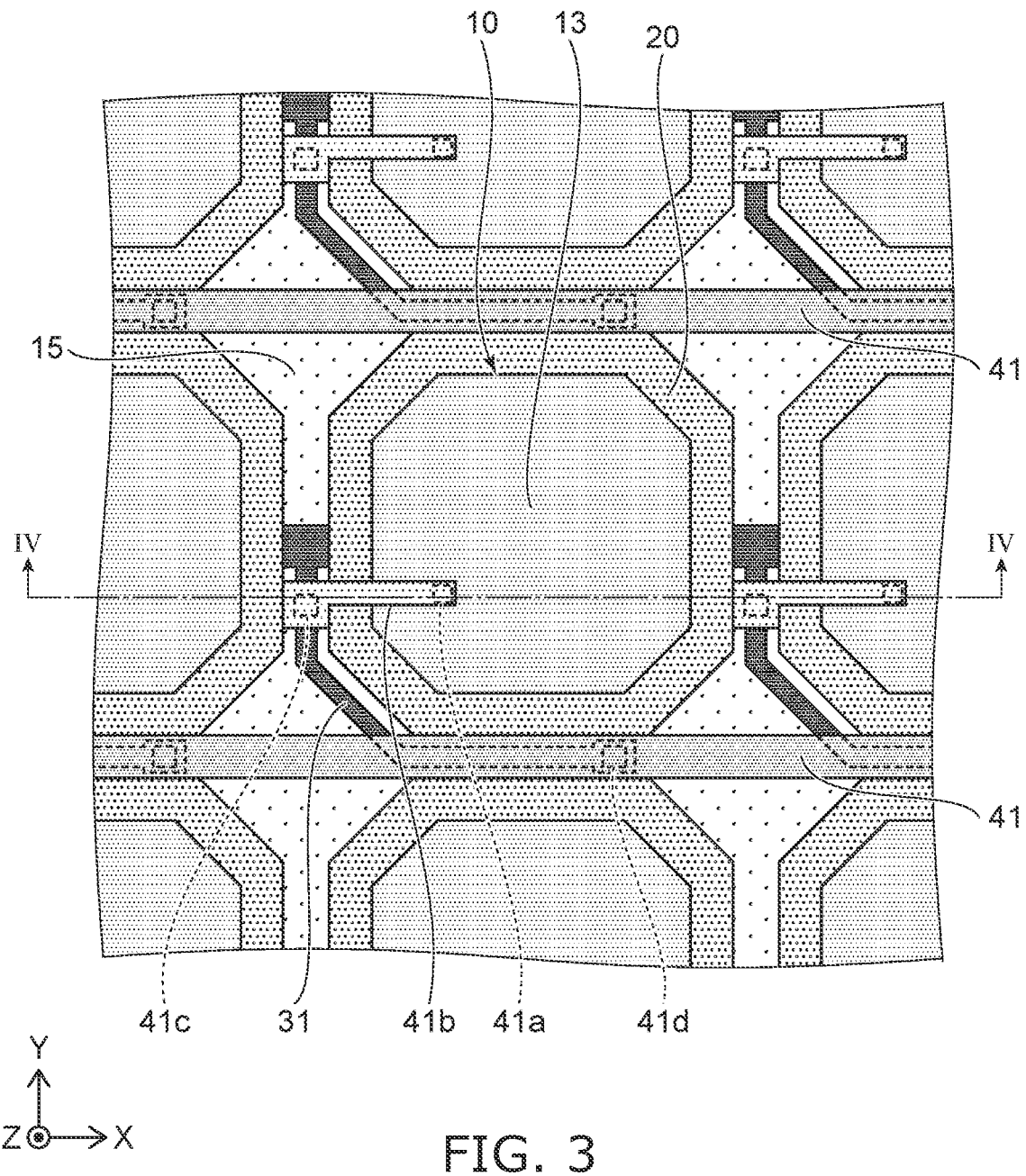
FIG. 3 is an enlarged plan view of portion III of FIG. 2.
Figure 4:
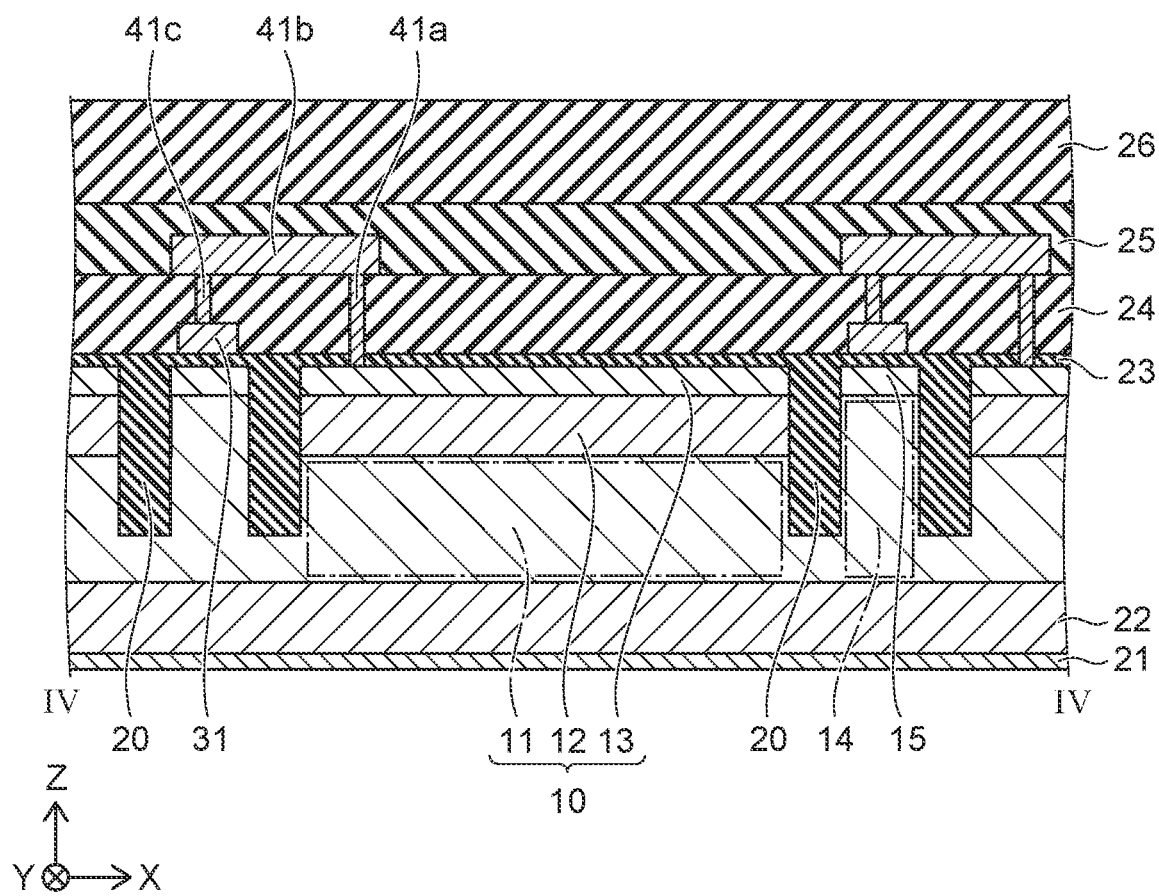
FIG. 4 is a IV-IV cross-sectional view of FIG. 3.

FIG. 1 is a schematic plan view illustrating a light detector according to a first embodiment. FIG. 2 is an enlarged schematic plan view of a portion of FIG. 1. FIG. 3 is an enlarged plan view of portion III of FIG. 2. FIG. 4 is a IV-IV cross-sectional view of FIG. 3.

As shown in FIGS. 1 and 2, the light detector 1 according to the first embodiment includes a cell region CR, an outer perimeter region OR, a first interconnect 41, a second interconnect 42, a first pad 51, and a second pad 52.

As shown in FIGS. 3 and 4, the cell region CR includes a p$^-$-type (first-conductivity-type) semiconductor region 11 (a first semiconductor region), a p-type semiconductor region 12 (a second semiconductor region), an n$^+$-type (second-conductivity-type) semiconductor region 13 (a third semiconductor region), a p$^-$-type semiconductor region 14 (a fourth semiconductor region), an n$^+$-type semiconductor region 15 (a fifth semiconductor region), a separation part 20, an electrode 21, a semiconductor layer 22, insulating layers 23 to 26, a first quenching part 31, and the first interconnect 41. The insulating layers 23 to 26 are not illustrated in FIGS. 2 and 3.

Here, the direction from the p$^-$-type semiconductor region 11 toward the p-type semiconductor region 12 is taken as a Z-direction (a third direction). One direction perpendicular to the Z-direction is taken as an X-direction (a first direction). One direction that is perpendicular to the Z-direction and crosses the X-direction is taken as a Y-direction (a second direction). The Y-direction may be orthogonal to the X-direction. In the description, the direction from the p$^-$-type semiconductor region 11 toward the p-type semiconductor region 12 is called "up", and the opposite direction is called "down". These directions are based on the relative positional relationship between the p$^-$-type semiconductor region 11 and the p-type semiconductor region 12 and are independent of the direction of gravity.

As shown in FIG. 4, the semiconductor layer 22 is located on the electrode 21. The p$^-$-type semiconductor regions 11 and 14 are located on the semiconductor layer 22. The p-type semiconductor region 12 is located on the p$^-$-type semiconductor region 11. The n$^+$-type semiconductor region 13 is located on the p-type semiconductor region 12.

The separation part 20 is located around an element 10 that includes the p$^-$-type semiconductor region 11, the p-type semiconductor region 12, and the n$^+$-type semiconductor region 13 in the X-Y plane (a first plane). The separation part 20 is composed of insulator. The p$^-$-type semiconductor region 14 is located around the separation part 20 and around the p$^-$-type semiconductor region 11 and the p-type semiconductor region 12 in the X-Y plane. The n$^+$-type semiconductor region 15 is located on the p$^-$-type semiconductor region 14. For example, the p-type semiconductor region 12 and the n$^+$-type semiconductor region 13 contact the separation part 20. The n$^+$-type semiconductor region 15 contacts the separation part 20.

p-n junctions are formed between the p-type semiconductor region 12 and the n$^+$-type semiconductor region 13 and between the p$^-$-type semiconductor region 14 and the n$^+$-type semiconductor region 15. For example, these p-n junction surfaces are parallel to the X-Y plane.

The p-type impurity concentration in the p-type semiconductor region 12 is greater than the p-type impurity concentration in the p$^-$-type semiconductor region 11 and greater than the p-type impurity concentration in the p$^-$-type semiconductor region 14. The p-type impurity concentration in the p$^-$-type semiconductor region 11 may be equal to the p-type impurity concentration in the p$^-$-type semiconductor region 14 or different from the p-type impurity concentration in the p$^-$-type semiconductor region 14. The lower portion of the p$^-$-type semiconductor region 11 may be linked to the lower portion of the p$^-$-type semiconductor region 14.

The n-type impurity concentration in the n$^+$-type semiconductor region 13 is greater than the p-type impurity concentration in the p-type semiconductor region 12. The n-type impurity concentration in the n$^+$-type semiconductor region 15 is greater than the p-type impurity concentration in the p$^-$-type semiconductor region 14. The n-type impurity concentration in the n$^+$-type semiconductor region 13 may be equal to the n-type impurity concentration in the n$^+$-type semiconductor region 15 or different from the n-type impurity concentration in the n$^+$-type semiconductor region 15.

For example, the thickness in the Z-direction of the p$^-$-type semiconductor region 14 is equal to the sum of the thickness in the Z-direction of the p$^-$-type semiconductor region 11 and the thickness in the Z-direction of the p-type semiconductor region 12.

As shown in FIG. 3, the multiple elements 10 are arranged in the X-direction and the Y-direction. The multiple separation parts 20 are located respectively around the multiple elements 10 in the X-Y plane. The multiple p$^-$-type semiconductor regions 14 are separated from each other by the multiple separation parts 20. Also, the multiple n$^+$-type semiconductor regions 15 are separated from each other by the multiple separation parts 20. The separation part 20 suppresses the movement of carriers between the adjacent p$^-$-type semiconductor regions 14 and between the adjacent n$^+$-type semiconductor regions 15. One p$^-$-type semiconductor region 14 and one n$^+$-type semiconductor region 15 are located around the multiple separation parts 20 in the X-Y plane. The multiple separation parts 20 are separated from each other in the X-direction and the Y-direction.

The insulating layer 23 is located on the multiple elements 10, the n$^+$-type semiconductor region 15, and the multiple separation parts 20. An insulating layer 24 is located on the insulating layer 23. An insulating layer 25 is located on the insulating layer 24. The insulating layer 26 is located on the insulating layer 25. The insulating layers 23 to 26 are light-transmissive.

As shown in FIG. 3, the n$^+$-type semiconductor region 13 and the first quenching part 31 are electrically connected to the first interconnect 41. For example, the n$^+$-type semiconductor region 13 is electrically connected to the first interconnect 41 via a plug 41a, an interconnect 41b, a plug 41c, the first quenching part 31, and a plug 41d. In other words, the first quenching part 31 is located between the n$^+$-type semiconductor region 13 and the first interconnect 41 and electrically connected to the n$^+$-type semiconductor region 13 and the first interconnect 41.

The electrical resistance of the first quenching part 31 is greater than the electrical resistances of the plug 41a, the interconnect 41b, the plug 41c, and the plug 41d. It is favorable for the electrical resistance of the first quenching part 31 to be not less than 50 kΩ and not more than 6 MΩ.

At least a portion of the first quenching part 31 is positioned above the n$^+$-type semiconductor region 15 or the separation part 20. The first quenching part 31 is not located on the element 10. Thereby, the first quenching part 31 can be prevented from shielding the light that travels toward the element 10.

The first interconnect 41 extends along the X-direction. One first interconnect 41 is electrically connected to multiple n$^+$-type semiconductor regions 13 arranged in the X-direction. As shown in FIG. 2, multiple first interconnects 41 are located in the Y-direction. As shown in FIG. 1, the multiple first interconnects 41 are electrically connected to the first pad 51 via a common line 50. The first pad 51 is electrically connected to an external electronic device via a bonding wire, etc.

Figure 5:
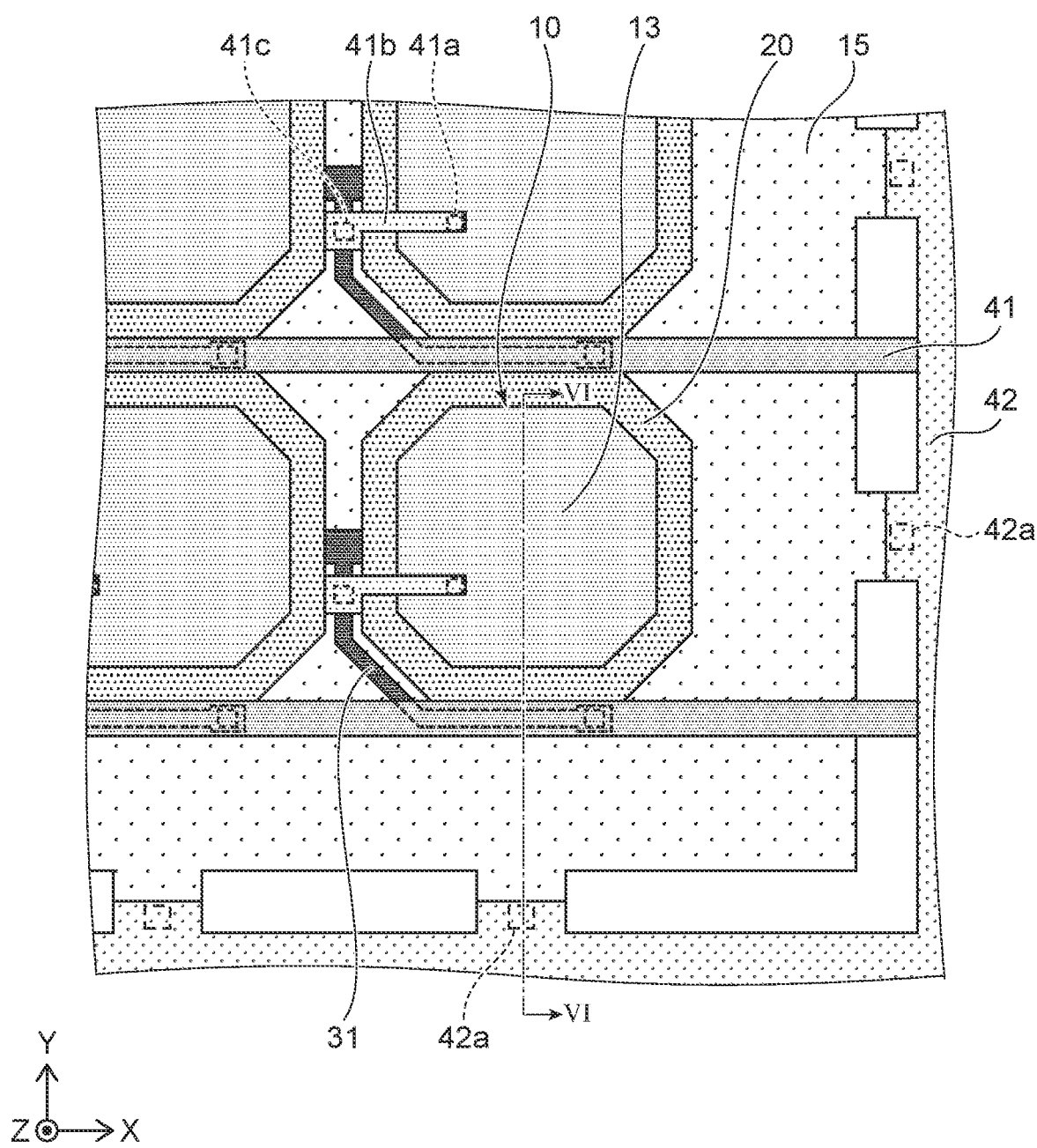
FIG. 5 is an enlarged plan view of portion V of FIG. 2.
Figure 6:
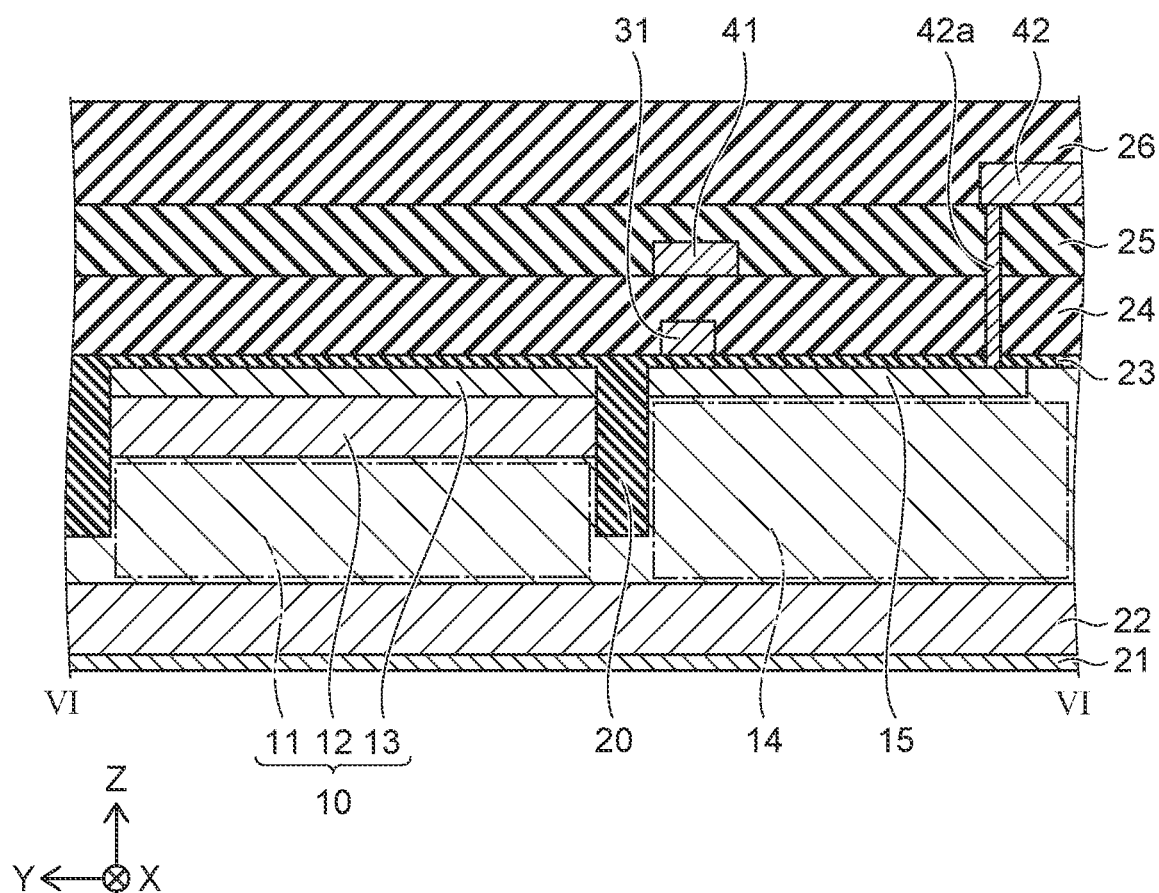
FIG. 6 is a VI-VI cross-sectional view of FIG. 5.

FIG. 5 is an enlarged plan view of portion V of FIG. 2. FIG. 6 is a VI-VI cross-sectional view of FIG. 5.

The outer perimeter region OR is located around the cell region CR. As shown in FIGS. 5 and 6, the outer perimeter region OR includes the p$^-$-type semiconductor region 14, the n$^+$-type semiconductor region 15, the insulating layers 23 to 26, and the second interconnect 42. The p$^-$-type semiconductor region 14, the n$^+$-type semiconductor region 15, and the insulating layers 23 to 26 also are located in the outer perimeter region OR as well as the cell region CR. The insulating layers 23 to 26 are not illustrated in FIG. 5.

The n$^+$-type semiconductor region 15 is electrically connected to the second interconnect 42 in the outer perimeter region OR. For example, as shown in FIG. 5, the n$^+$-type semiconductor region 15 is electrically connected to the second interconnect 42 at multiple points. More specifically, a portion of the X-direction end portion and a portion of the Y-direction end portion of the n$^+$-type semiconductor region 15 protrude outward and are electrically connected to the second interconnect 42 via multiple plugs 42a.

The second interconnect 42 is separated from the first interconnect 41 and electrically isolated from the first interconnect 41. As shown in FIG. 1, the second interconnect 42 is electrically connected to the second pad 52. The second pad 52 is separated from the first pad 51. The second pad 52 is electrically connected to an external electronic device via a bonding wire, etc. A signal that is different from the signal flowing through the second interconnect 42 can be extracted from the first pad 51. A signal that is different from the signal flowing through the first interconnect 41 can be extracted from the second pad 52.

Operations of the light detector 1 will now be described.

A charge is generated by the element 10 when light is incident on the element 10 from above. An electric current flows in the first quenching part 31 and the first interconnect 41 when the charge is generated. An output electric current that corresponds to the incident light of the element 10 can be detected by detecting the electric current flowing in the first interconnect 41.

The p$^-$-type semiconductor regions 11 and 14 are electrically connected to the electrode 21 via the semiconductor layer 22. The n$^+$-type semiconductor region 13 is electrically connected to the first pad 51 via the first interconnect 41. The n$^+$-type semiconductor region 15 is electrically connected to the second pad 52 via the second interconnect 42. A voltage can be applied between the p-type semiconductor region 12 and the n$^+$-type semiconductor region 13 and between the p$^-$-type semiconductor region 14 and the n$^+$-type semiconductor region 15 by controlling the electric potentials of the first pad 51, the second pad 52, and the electrode 21.

For example, a negative voltage with respect to the first pad 51 is applied to the electrode 21. Thereby, a reverse voltage is applied between the p-type semiconductor region 12 and the n$^+$-type semiconductor region 13. The element 10 functions as an avalanche photodiode.

A reverse voltage that is greater than the breakdown voltage may be applied between the p-type semiconductor region 12 and the n$^+$-type semiconductor region 13. In other words, the element 10 may operate in a Geiger mode. By operating in the Geiger mode, a pulse signal that has a high multiplication factor (i.e., a high gain) is output. The light-receiving sensitivity of the light detector 1 can be increased thereby. The element 10 functions as a single photon avalanche diode for detecting faint light.

The electric potential of the second pad 52 may be controlled to be substantially equal to the electric potential of the first pad 51. Thereby, a reverse voltage is applied between the p$^-$-type semiconductor region 14 and the n$^+$-type semiconductor region 15. The p$^-$-type semiconductor region 14 and the n$^+$-type semiconductor region 15 function as an avalanche photodiode.

The first quenching part 31 is provided to suppress the continuation of avalanche breakdown when avalanche breakdown occurs due to the incidence of light on the element 10. A voltage drop that corresponds to the electrical resistance of the first quenching part 31 occurs when avalanche breakdown occurs and an electric current flows in the first quenching part 31. The electric potential difference between the p-type semiconductor region 12 and the n$^+$-type semiconductor region 13 is reduced by the voltage drop, and the avalanche breakdown stops. Thereby, the element 10 has a fast response with a short time constant; and the next light that is incident on the element 10 can be detected.

As described above, a resistor that generates a large voltage drop may be provided as the first quenching part 31; instead of a resistor, a control circuit that blocks the electric current may be provided as the first quenching part 31. A known configuration called an active quenching circuit is applicable to the control circuit. For example, the control circuit includes a comparator, a control logic part, and two switching elements, and is electrically connected to the first interconnect 41. The control circuit may be located in the cell region CR, and may be located in the outer perimeter region OR.

An example of materials of the components will now be described.

The semiconductor regions of the p$^-$-type semiconductor region 11, the p-type semiconductor region 12, the n$^+$-type semiconductor region 13, the p$^-$-type semiconductor region 14, the n$^+$-type semiconductor region 15, etc., include at least one semiconductor material selected from the group consisting of silicon, silicon carbide, gallium arsenide, and gallium nitride. Phosphorus, arsenic, or antimony is used as the n-type impurity when these semiconductor regions include silicon. Boron or boron fluoride is used as the p-type impurity.

The p-type impurity concentrations in the p$^-$-type semiconductor regions 11 and 14 are, for example, not less than $1.0 \times 10^{13}$ atoms/cm$^3$ and not more than $1.0 \times 10^{16}$ atoms/cm$^3$. The p-type impurity concentration in the p-type semiconductor region 12 is, for example, not less than $1.0 \times 10^{16}$ atoms/cm$^3$ and not more than $1.0 \times 10^{18}$ atoms/cm$^3$. The n-type impurity concentrations in the n$^+$-type semiconductor regions 13 and 15 are, for example, not less than $1.0 \times 10^{18}$ atoms/cm$^3$ and not more than $1.0 \times 10^{21}$ atoms/cm$^3$.

The semiconductor layer 22 is, for example, at least a portion of a p-type semiconductor substrate. The semiconductor layer 22 includes the semiconductor material described above. The p-type impurity concentration in the semiconductor layer 22 is not less than $1.0\times10^{17}$ atoms/cm$^3$ and not more than $1.0\times10^{21}$ atoms/cm$^3$.

The separation part 20 and the insulating layers 23 to 26 include insulating materials. For example, the separation part 20 and the insulating layers 23 to 26 include silicon and one selected from the group consisting of oxygen and nitrogen. For example, the separation part 20 and the insulating layers 23 to 26 include silicon oxide or silicon nitride. The first quenching part 31 that is used as a resistor includes polysilicon as a semiconductor material. An n-type impurity or a p-type impurity may be added to the first quenching part 31.

The plugs 41a, 41c, 41d, and 42a include metal materials. For example, the plugs 41a, 41c, 41d, and 42a include at least one selected from the group consisting of titanium, tungsten, copper, and aluminum. The plugs 41a, 41c, 41d, and 42a may include a silicon compound or a nitride of at least one selected from the group consisting of titanium, tungsten, copper, and aluminum.

The electrode 21, the first interconnect 41, the interconnect 41b, the second interconnect 42, the first pad 51, and the second pad 52 include at least one selected from the group consisting of copper and aluminum.

FIGS. 7A to 12B are schematic cross-sectional views illustrating manufacturing processes of the light detector according to the first embodiment.

An example of manufacturing processes of the light detector according to the first embodiment will now be described with reference to FIGS. 7A to 12B.

Figure 7A:
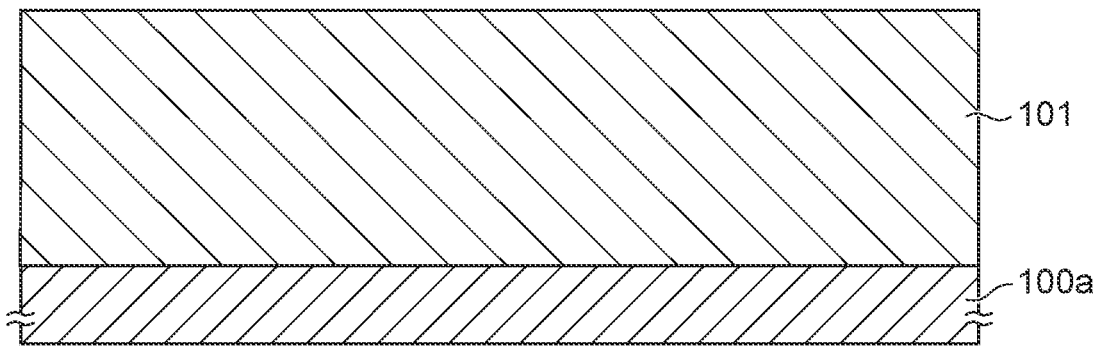
FIGS. 7A and 7B are schematic cross-sectional views illustrating manufacturing processes of the light detector according to the first embodiment.

As shown in FIG. 7A, a substrate that includes a silicon substrate 100a and a p-type silicon epitaxial layer 101 is prepared. The direction from the silicon substrate 100a toward the silicon epitaxial layer 101 corresponds to the Z-direction. The silicon epitaxial layer 101 is formed by epitaxially growing silicon on the silicon substrate 100a. The silicon substrate 100a and the silicon epitaxial layer 101 include single-crystal p-type silicon doped with boron. The boron concentration in the silicon substrate 100a is $4.0\times10^{18}$ cm$^{-3}$. The boron concentration in the silicon epitaxial layer 101 is $1.0\times10^{18}$ cm$^{-3}$. The thickness of the silicon epitaxial layer 101 is 10 μm.

Figure 7B:
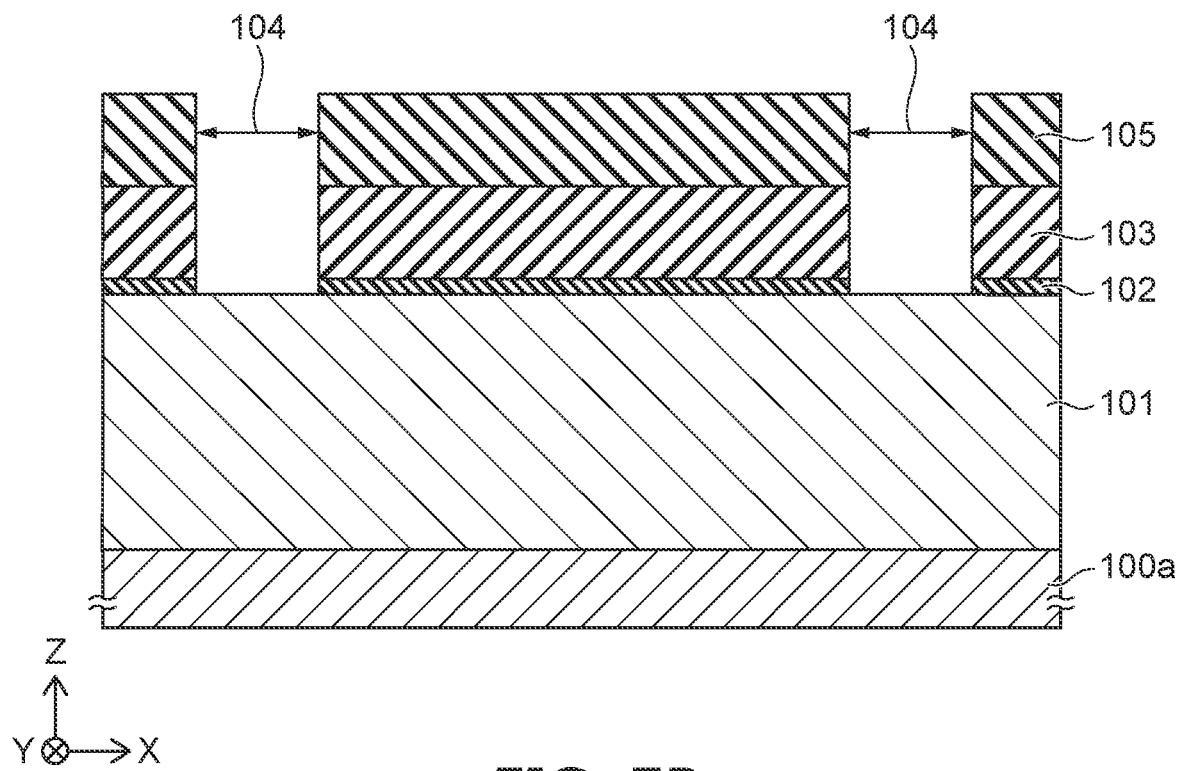

A silicon oxide film 102 that has a thickness of 100 nm is formed by oxidizing the surface of the silicon epitaxial layer 101. A silicon oxide film 103 of 1 μm is deposited on the silicon oxide film 102 by low pressure thermal CVD. A resist 105 that defines an element separation region 104 is formed by a lithography process. The shape of the element separation region 104 when viewed along the Z-direction corresponds to the shape of the separation part 20 when viewed along the Z-direction. As shown in FIG. 7B, the silicon oxide film 103 and the silicon oxide film 102 are etched via an opening of the resist 105 by reactive ion etching (RIE). The width of the element separation region 104 is 1 μm.

Figure 8A:
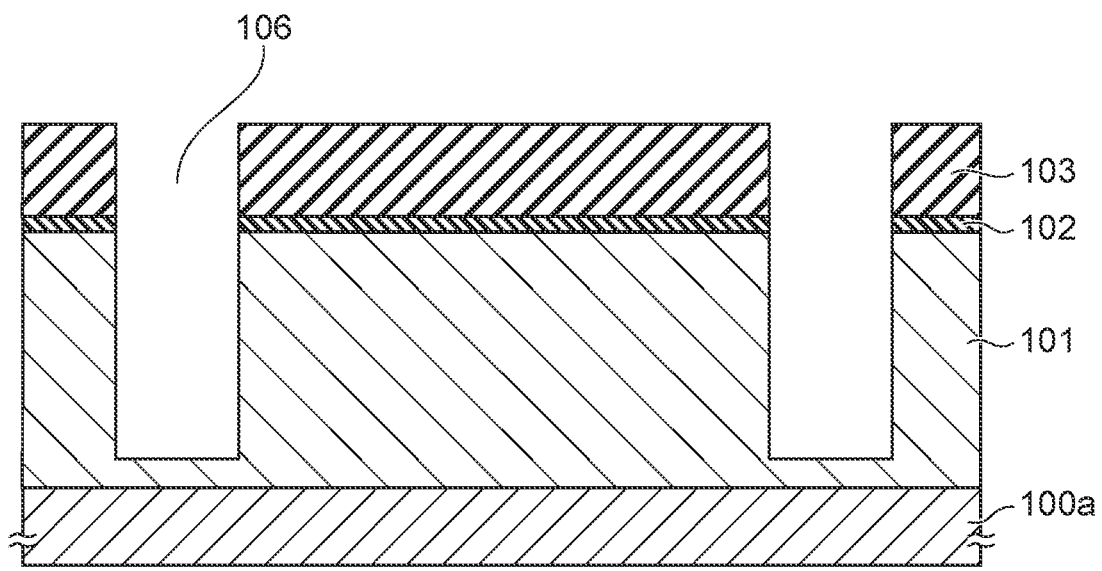
FIGS. 8A and 8B are schematic cross-sectional views illustrating manufacturing processes of the light detector according to the first embodiment.

The resist 105 is stripped away. The silicon epitaxial layer 101 of the element separation region 104 is etched using the silicon oxide film 103 as a mask. As shown in FIG. 8A, a first trench 106 is formed thereby. The etching depth is, for example, 8 μm. It is favorable to provide a taper angle of about 2° when forming the first trench 106. The taper angle is the tilt of the side surface of the first trench 106 with respect to the Z-direction. The occurrence of voids when subsequently filling with an oxide film can be suppressed thereby.

Figure 8B:
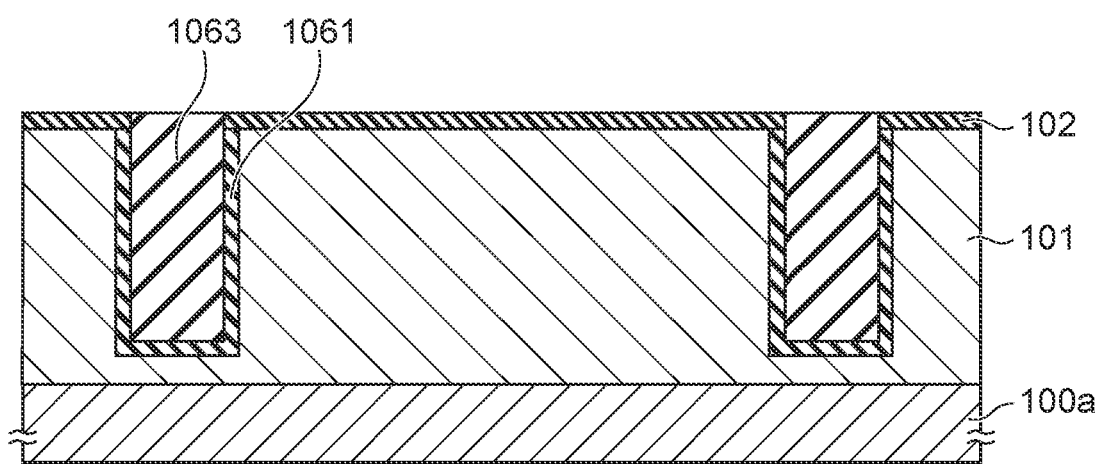
Figure 8B:
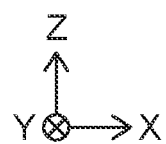

A silicon oxide film 1061 that has a thickness of 50 nm is formed by oxidizing the surface of the first trench 106. A buried oxide film 1063 of 1.2 μm is deposited by plasma-enhanced chemical vapor deposition (CVD). The structure of the buried oxide film 1063 is densified by performing nitrogen annealing at 1000° C. As shown in FIG. 8B, the buried oxide film 1063 is planarized by chemical mechanical polishing (CMP) processing.

Figure 9A:
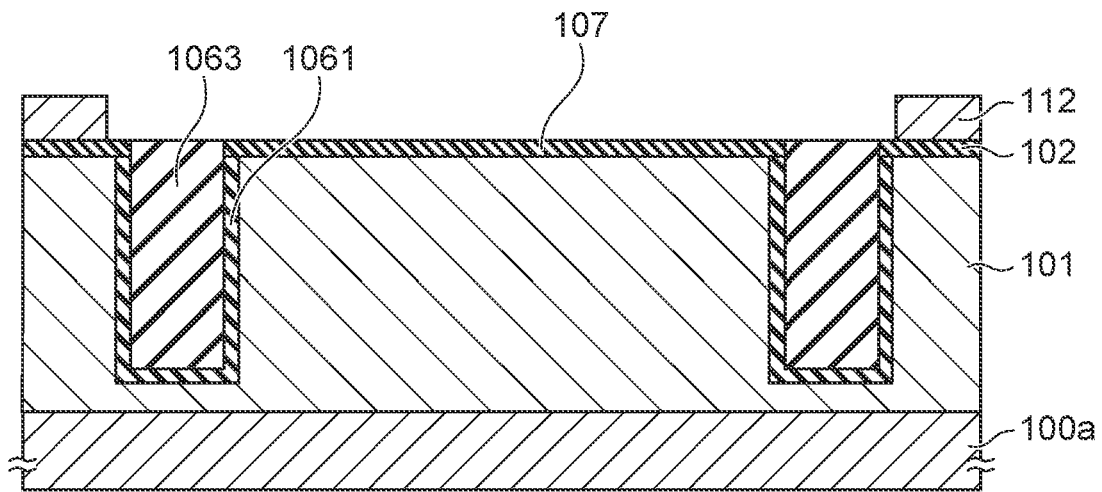
FIGS. 9A and 9B are schematic cross-sectional views illustrating manufacturing processes of the light detector according to the first embodiment.

The silicon oxide film 102 is stripped away by hydrofluoric acid treatment. A silicon oxide film 107 that has a thickness of 50 nm is formed by oxidizing the surface of the silicon epitaxial layer 101. A polysilicon film that has a thickness of 0.2 μm is formed by low pressure thermal CVD. The polysilicon film is patterned into a prescribed shape by a lithography process and an RIE process. As shown in FIG. 9A, a quenching resistance 112 is formed thereby. To adjust the resistance of the quenching resistance 112, for example, $1.0\times10^{15}$ cm$^{-2}$ of an impurity is implanted by implanting boron with an implantation acceleration voltage of 20 keV and by performing an activation anneal.

Figure 9B:
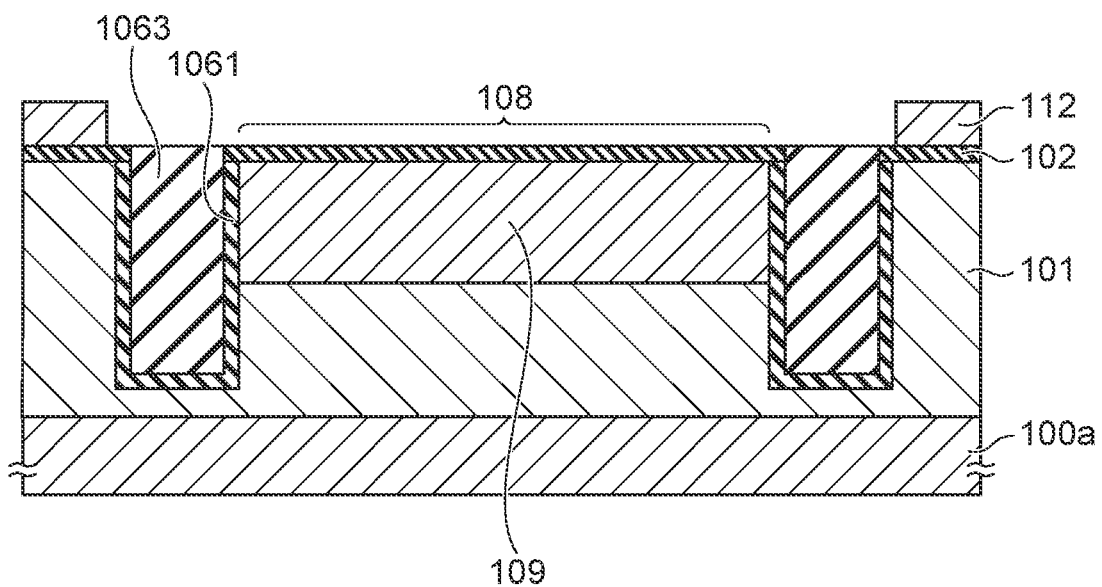

As shown in FIG. 9B, a p-type avalanche layer 109 is partially formed in an element region 108 surrounded with the buried oxide film 1063 by a lithography process and an ion implantation process. The p-type avalanche layer 109 is formed by ion implantation of boron. The p-type avalanche layer 109 is formed so that the boron has a peak depth of 0.8 μm and a peak concentration of $1.0\times10^{17}$ cm$^{-3}$.

Figure 10A:
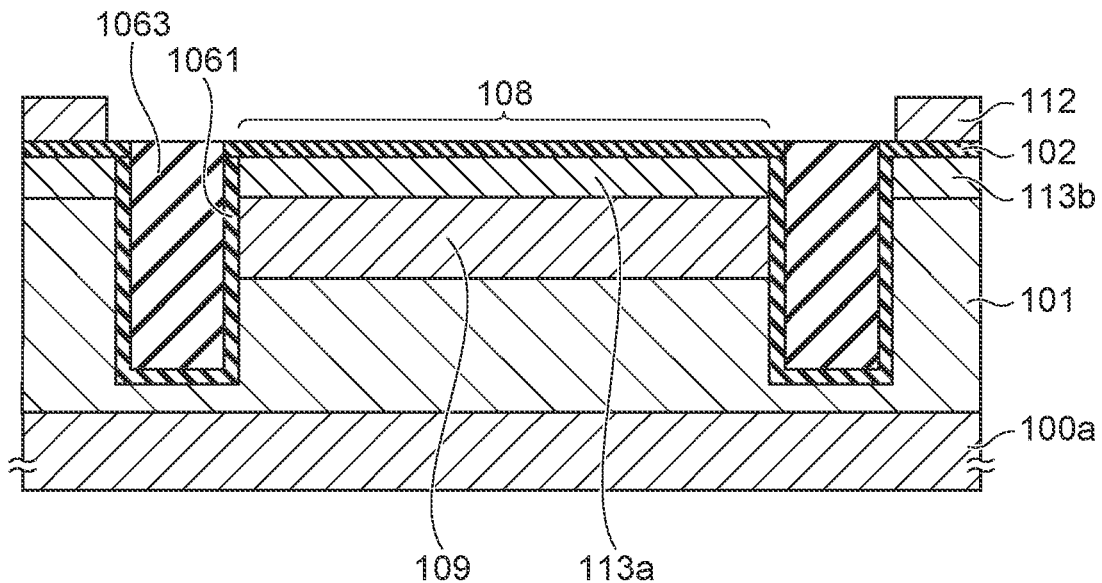
FIGS. 10A and 10B are schematic cross-sectional views illustrating manufacturing processes of the light detector according to the first embodiment.

As shown in FIG. 10A, n$^+$-type avalanche layers 113a and 113b are formed by an ion implantation process. The n$^+$-type avalanche layer 113a is formed at the surface of the p-type avalanche layer 109. The n$^+$-type avalanche layer 113b is formed at the silicon epitaxial layer 101 surface between the buried oxide films 1063 and at the outer perimeter of the multiple element regions 108. The n$^+$-type avalanche layers 113a and 113b are formed by ion implantation of phosphorus. The n$^+$-type avalanche layers 113a and 113b are formed to have peak concentrations of $1.5\times10^{20}$ cm$^{-3}$. Annealing is performed in a nitrogen atmosphere to activate the n$^+$-type avalanche layers 113a and 113b.

Figure 10B:
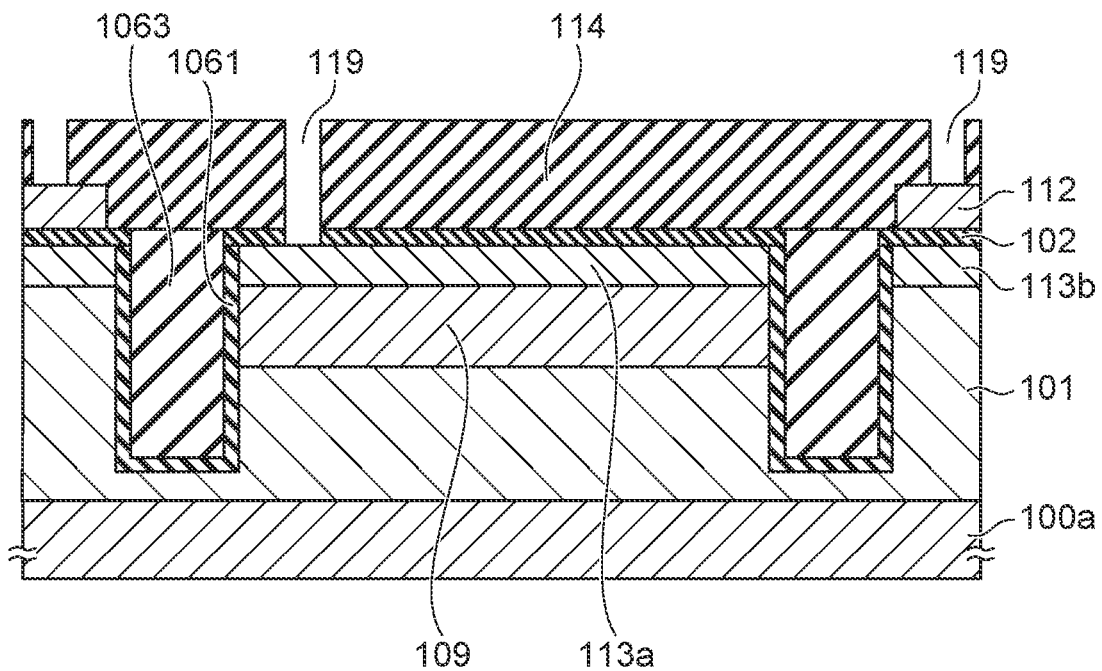

An insulating film 114 that has a thickness of 0.5 μm is formed by CVD. As shown in FIG. 10B, multiple contact holes 119 are formed by a lithography process and an RIE process. The multiple contact holes 119 are formed on the quenching resistance 112 and the n$^+$-type avalanche layer 113a.

Figure 11A:
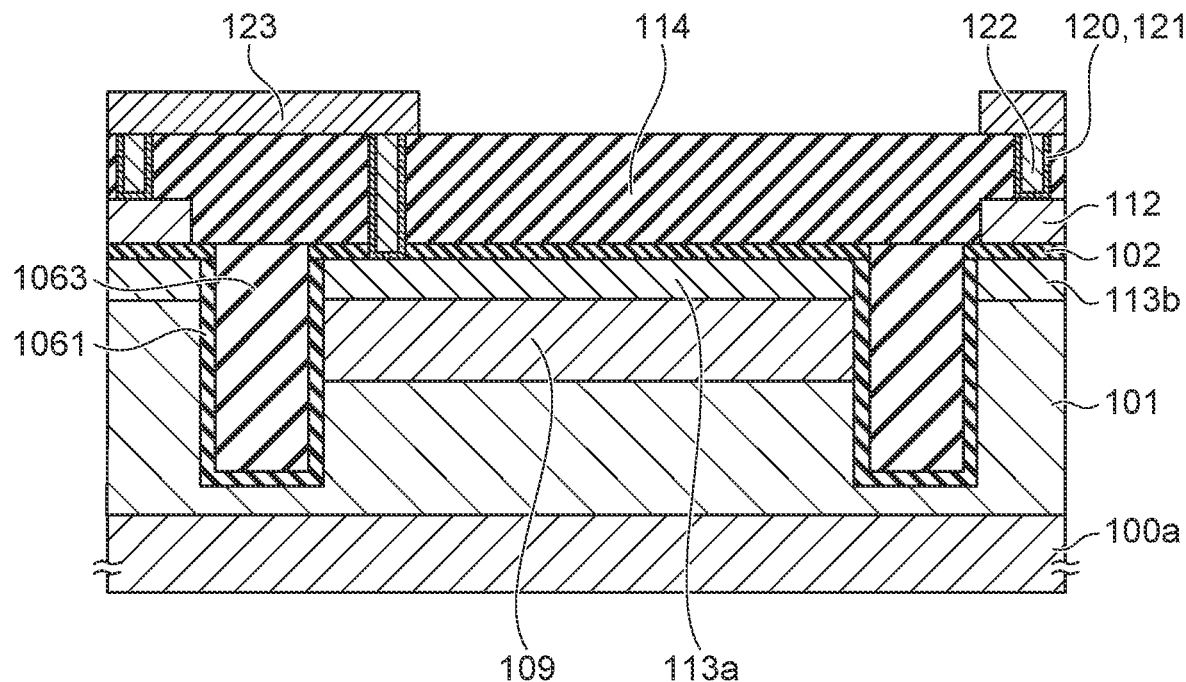
FIGS. 11A and 11B are schematic cross-sectional views illustrating the manufacturing process of the light detector according to the first embodiment.

A titanium film 120 and a titanium nitride film 121 each of 10 nm are formed by sputtering along the inner surface of the contact hole 119. A tungsten film 122 of 0.3 μm is formed by CVD on the titanium nitride film 121. The titanium film 120, the titanium nitride film 121, and the tungsten film 122 are planarized by CMP using the insulating film 114 as a stopper. Thereby, the contact hole 119 is filled with the titanium film 120, the titanium nitride film 121, and the tungsten film 122. An aluminum layer 123 that has a thickness of 0.5 μm is formed by sputtering. As shown in FIG. 11A, the aluminum layer 123 is patterned into a prescribed shape by a lithography process and an RIE process.

Figure 11B:
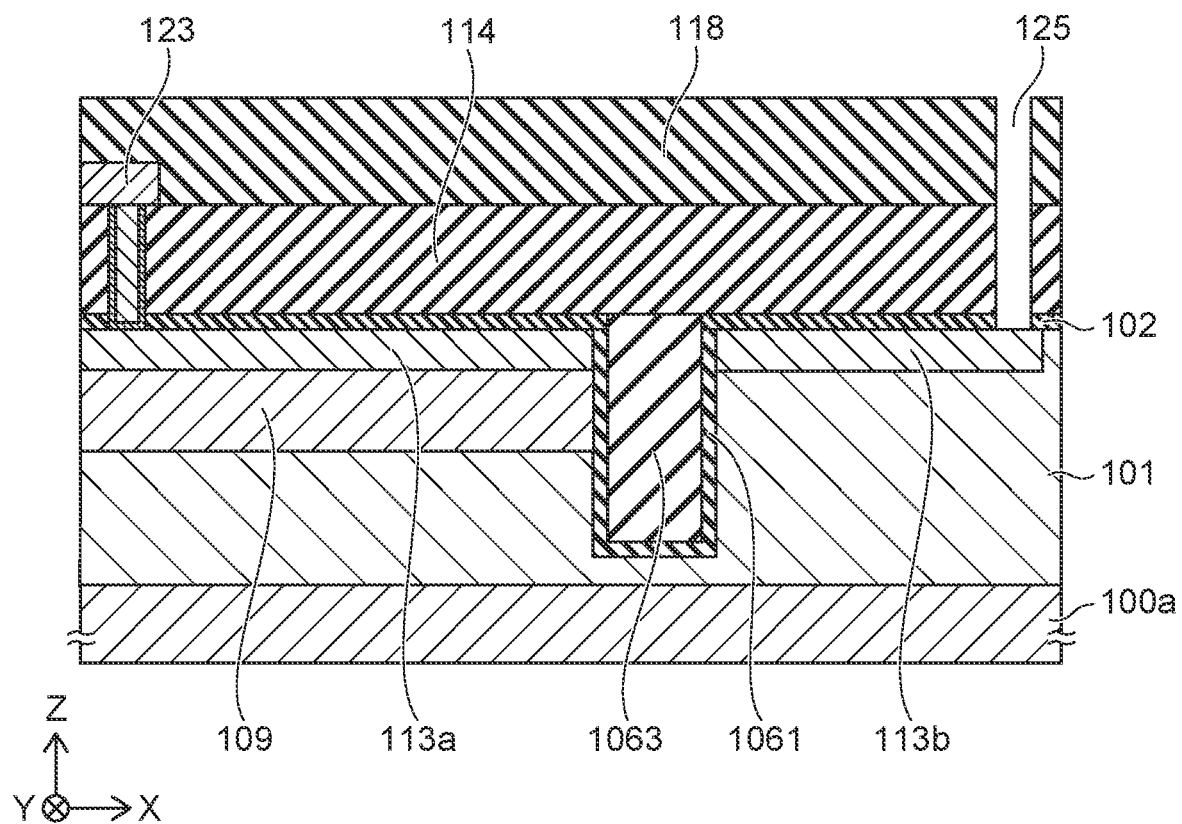

An insulating film 118 that has a thickness of 0.3 μm is formed by CVD. FIGS. 11B to 12B show states at the outer perimeter of the multiple element regions 108. As shown in FIG. 11B, a contact hole 125 that extends through the insulating film 118, the insulating film 114, and the silicon oxide film 107 is formed by a lithography process and an RIE process. The contact hole 125 is formed on the n$^+$-type avalanche layer 113b.

Figure 12A:
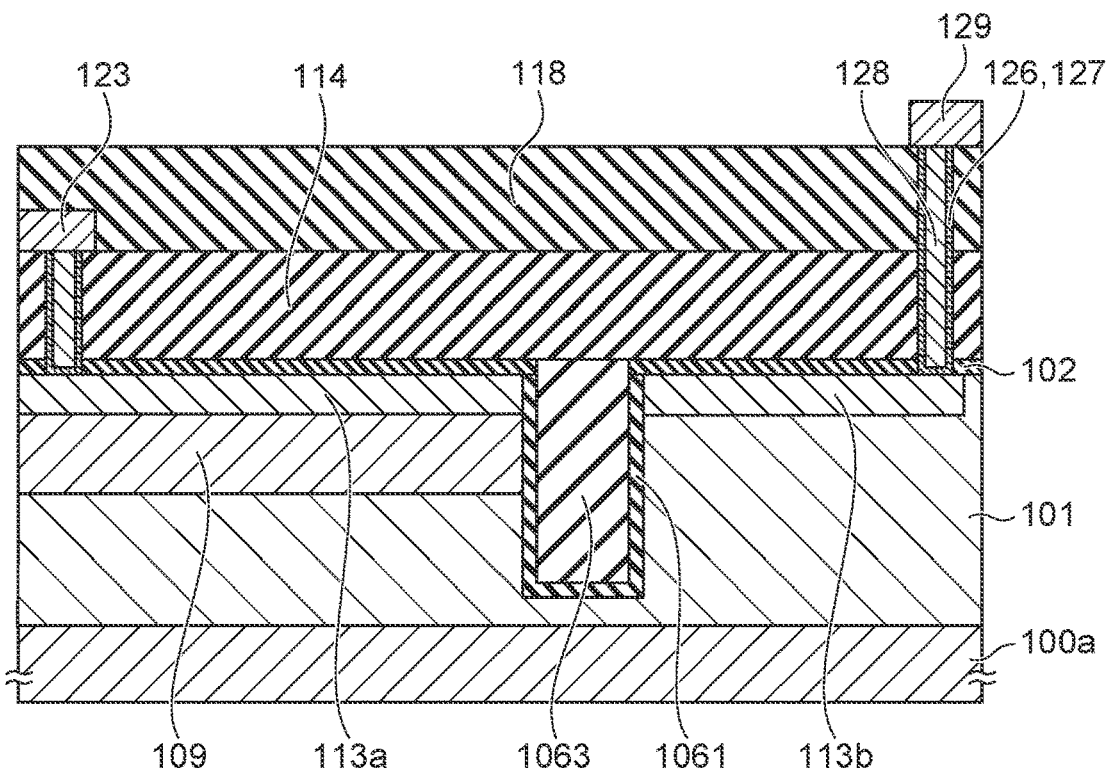
FIGS. 12A and 12B are schematic cross-sectional views illustrating manufacturing processes of the light detector according to the first embodiment.

A titanium film 126 and a titanium nitride film 127 each of 10 nm are formed by sputtering along the inner surface of the contact hole 125. A tungsten film 128 of 0.3 μm is formed by CVD on the titanium nitride film 127. The titanium film 126, the titanium nitride film 127, and the tungsten film 128 are planarized by CMP using the insulating film 118 as a stopper. Thereby, the contact hole 125 is filled with the titanium film 126, the titanium nitride film 127, and the tungsten film 128. An aluminum layer 129 that has a thickness of 0.5 μm is formed by sputtering. As shown in FIG. 12A, the aluminum layer 129 is patterned in a prescribed shape by a lithography process and an RIE process.

Figure 12B:
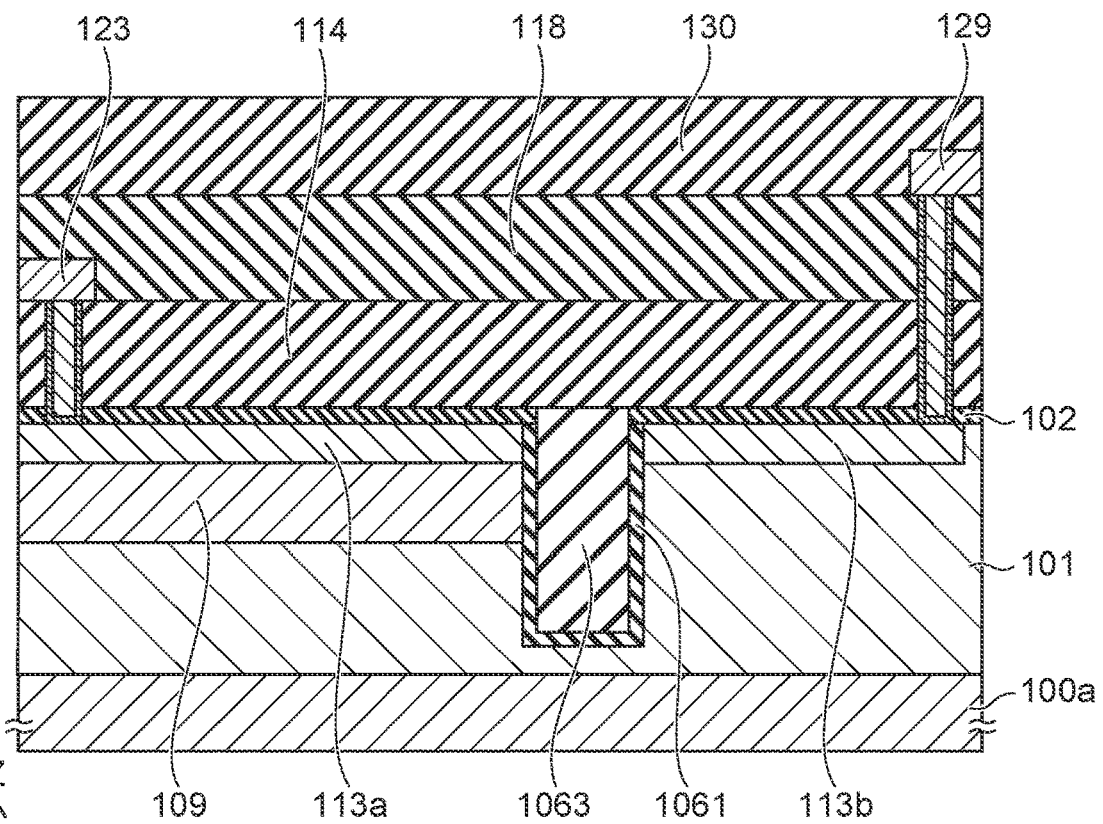

As shown in FIG. 12B, a silicon nitride film that has a thickness of 0.3 μm is formed by CVD as a passivation film 130. Subsequently, a portion of the aluminum layer 123 and a portion of the aluminum layer 129 are exposed as pads by forming openings in the passivation film 130. The back surface of the silicon substrate 100a is polished until the thickness of the silicon substrate 100a is 600 μm. A Ti film and a Au film are formed as a back electrode. The light detector 1 according to the embodiment is manufactured by the processes described above.

The silicon substrate 100a that is obtained by the manufacturing processes described above corresponds to the semiconductor layer 22 of the light detector 1. The silicon epitaxial layer 101 corresponds to the p⁻-type semiconductor regions 11 and 14. The p-type avalanche layer 109 corresponds to the p-type semiconductor region 12. The n⁺-type avalanche layer 113a corresponds to the n⁺-type semiconductor region 13. The n⁺-type avalanche layer 113b corresponds to the n⁺-type semiconductor region 15. The silicon oxide film 1061 and the buried oxide film 1063 correspond to the separation part 20. The silicon oxide film 107 corresponds to the insulating layer 23. The insulating film 114 corresponds to the insulating layer 24. The insulating film 118 corresponds to the insulating layer 25. The passivation film 130 corresponds to the insulating layer 26. The quenching resistance 112 corresponds to the first quenching part 31. The aluminum layer 123 corresponds to the first interconnect 41, the interconnect 41b, the common line 50, and the first pad 51. The aluminum layer 129 corresponds to the second interconnect 42 and the second pad 52.

Advantages of the first embodiment will now be described.

Figure 13A:
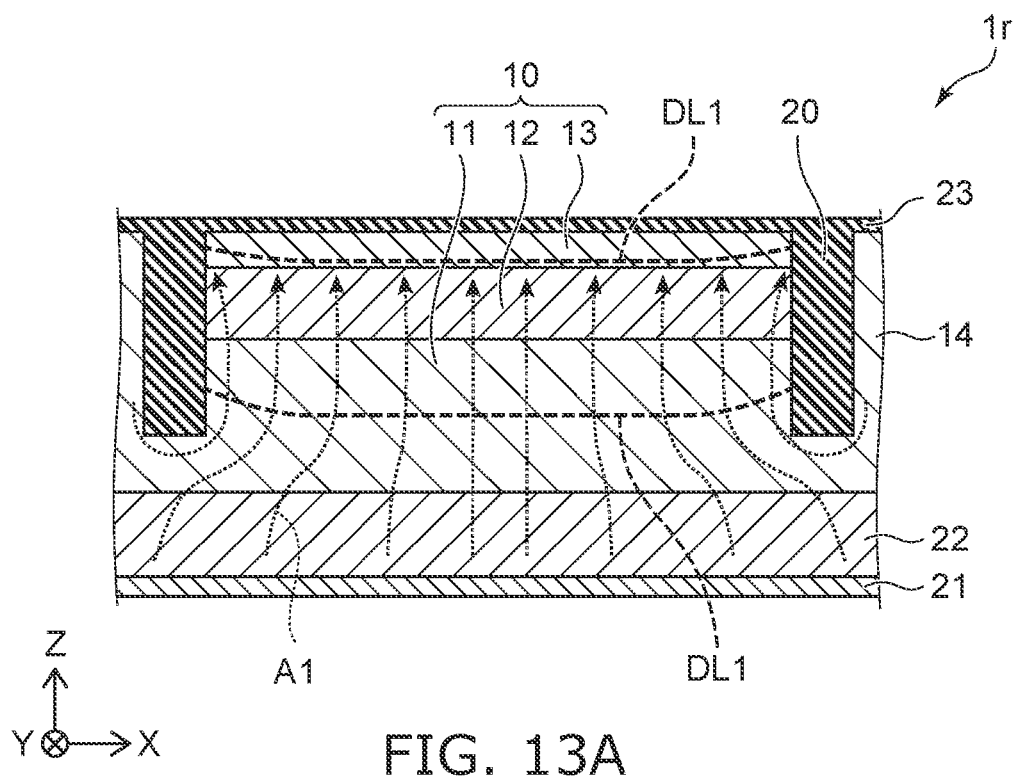
FIG. 13A is a schematic view showing characteristics of a light detector according to a reference example.
Figure 13B:
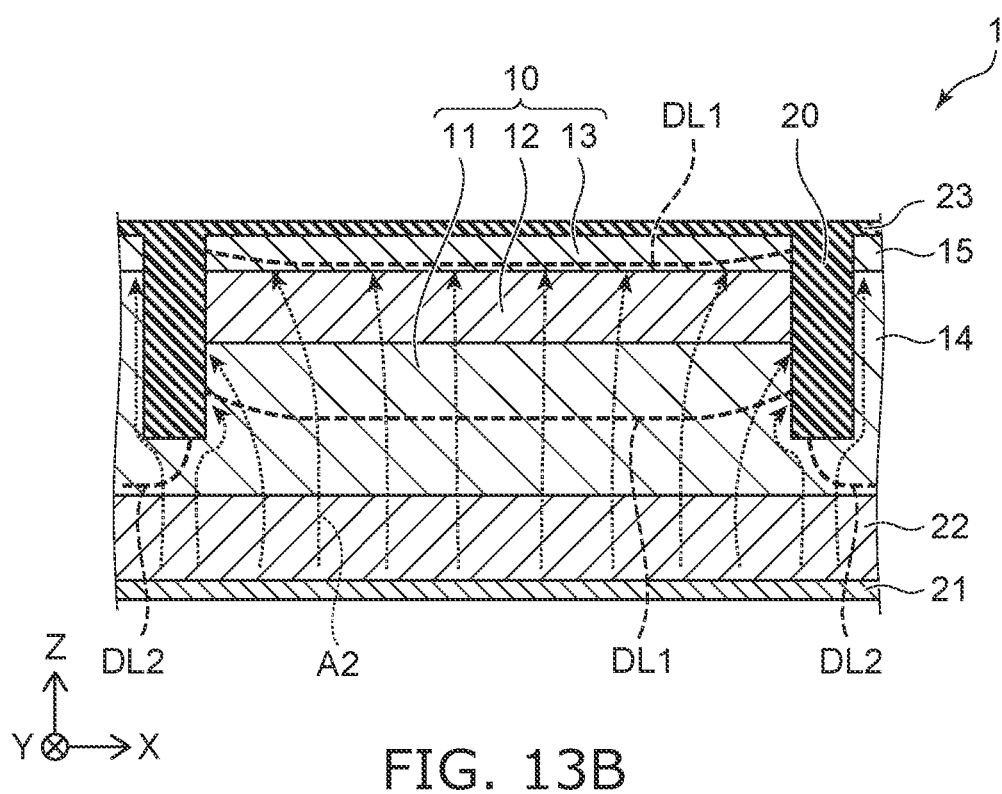
FIG. 13B is a schematic view showing characteristics of the light detector according to the first embodiment.

FIG. 13A is a schematic view showing characteristics of a light detector according to a reference example. FIG. 13B is a schematic view showing characteristics of the light detector according to the first embodiment.

The light detector 1r according to the reference example shown in FIG. 13A does not include the n⁺-type semiconductor region 15. Broken line arrows A1 and A2 of FIGS. 13A and 13B show the flow of the electrons generated in the p⁻-type semiconductor region 11 or the p⁻-type semiconductor region 14.

In the element 10 as shown in FIG. 13A, a depletion layer DL1 spreads from the interface between the p-type semiconductor region 12 and the n⁺-type semiconductor region 13 when a reverse voltage is applied between the p-type semiconductor region 12 and the n⁺-type semiconductor region 13. When light is incident on the element 10 and photoelectric conversion occurs in the depletion layer DL1, carriers drift through the depletion layer DL1, and avalanche breakdown occurs. A signal based on the avalanche breakdown flows in the first interconnect 41 and the first pad 51.

On the other hand, carriers are generated in the semiconductor layer 22, the p⁻-type semiconductor region 11, the p⁻-type semiconductor region 14, etc., even when light is not incident on the element 10 due to crystal defects, heat, etc., in the semiconductor regions. As shown by the arrows A1, when a voltage is applied between the p-type semiconductor region 12 and the n⁺-type semiconductor region 13, the carriers drift through the depletion layer DL1 and cause avalanche breakdown to occur. A signal (dark electric current) may flow in the first interconnect 41 and the first pad 51 based on avalanche breakdown even when light is not incident on the element 10. In other words, there is a possibility that erroneous detection of light may occur.

For this problem, the light detector 1 includes the p⁻-type semiconductor region 14 and the n⁺-type semiconductor region 15. As shown in FIG. 13B, a depletion layer DL2 spreads from the interface between the p⁻-type semiconductor region 14 and the n⁺-type semiconductor region 15 when a reverse voltage is applied between the p⁻-type semiconductor region 14 and the n⁺-type semiconductor region 15. A high p-type impurity concentration region such as the p-type semiconductor region 12 is not located between the p⁻-type semiconductor region 14 and the n⁺-type semiconductor region 15. Therefore, the depletion layer DL2 easily spreads lower than the depletion layer DL1 of the element 10. In other words, the breakdown voltage of the diode including the p⁻-type semiconductor region 14 and the n⁺-type semiconductor region 15 is greater than the breakdown voltage of the diode including the p-type semiconductor region 12 and the n⁺-type semiconductor region 13. For example, in the element 10, the entire p-type semiconductor region 12 is depleted, and the depletion layer DL1 spreads partway through the p⁻-type semiconductor region 11. Around of the element 10, the entire p⁻-type semiconductor region 14 is depleted, and the depletion layer DL2 spreads below the separation part 20.

The carriers that are generated in the p⁻-type semiconductor region 14 flow toward the n⁺-type semiconductor region 15 due to the depletion layer DL2. Also, a lateral electric field is generated below the separation part 20 by the spreading of the depletion layer DL2. The carriers that are generated below the separation part 20 are attracted toward the depletion layer DL2 by the lateral electric field. The carriers flow from the n⁺-type semiconductor region 15 of the cell region CR toward the n⁺-type semiconductor region 15 of the outer perimeter region OR and are ejected via the second interconnect 42. In other words, the dark electric current that flows toward the first interconnect 41 and the first pad 51 can be suppressed. According to the first embodiment, the erroneous detection of light by the light detector 1 can be suppressed, and the reliability of the light detector 1 can be increased.

The signal that is generated by the avalanche breakdown of the element 10 is extracted by the first pad 51 via the first interconnect 41. The signal that is generated in the p⁻-type semiconductor region 14 is ejected from the second pad 52 via the second interconnect 42. The accuracy of the light detection can be increased by using only the signal extracted from the first pad 51 to detect the light.

Figure 14:
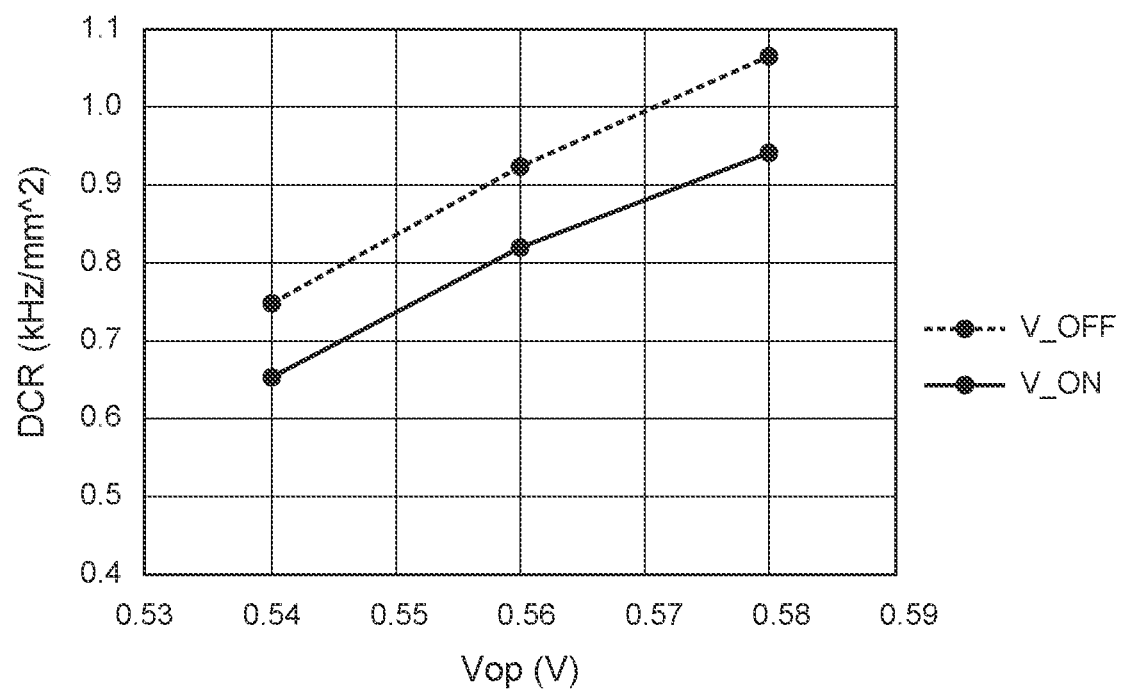
FIG. 14 is a graph showing experimental results relating to the light detectors according to the first embodiment and the reference example.

FIG. 14 is a graph showing experimental results relating to the light detectors according to the first embodiment and the reference example.

In FIG. 14, the horizontal axis is a negative voltage Vop with respect to the first and second pads 51 and 52 that is applied to the electrode 21. The vertical axis is a dark count rate DCR obtained for each voltage Vop. The values of the horizontal axis and the values of the vertical axis are relative values. The solid line is the experimental results relating to the light detector of the first embodiment. Specifically, the solid line shows the measurement results of the dark count rate DCR when the electric potential of the second pad 52 was set to be equal to the electric potential of the first pad 51. The voltage V was applied between the p⁻-type semiconductor region 14 and the n⁺-type semiconductor region 15 when the electric potential of the second pad 52 was fixed and the voltage Vop was applied to the electrode 21. The broken line is the experimental results relating to the light detector of the reference example. Specifically, the broken line shows the measurement results of the dark count rate DCR when the electric potential of the second pad 52 was not fixed and the electric potential of the second pad 52 was floating. In such a case, the voltage V was not applied between the p⁻-type semiconductor region 14 and the n⁺-type semiconductor region 15. The state in which the electric potential of the second pad 52 is floating corresponds to a configuration in which the n⁺-type semiconductor region 15, the second interconnect 42, the second pad 52, etc., are not included.

A lower dark count rate DCR means that the erroneous detection of light occurs less easily, and the reliability of the light detector is higher. From the results of FIG. 14, it was found that the dark count rate DCR when the electric potential of the second pad 52 was fixed was about 12% less than when the electric potential of the second pad 52 was floating.

According to the first embodiment, the n⁺-type semiconductor region 15 is electrically connected to the second interconnect 42 at the outer perimeter of the cell region CR. Many crystal defects occur when forming the separation part 20 in the region between the separation parts 20. When the n⁺-type semiconductor region 15 and the second interconnect 42 are electrically connected in the region between the separation parts 20, the connection resistance between the n⁺-type semiconductor region 15 and the second interconnect 42 may be increased by defects. Thereby, the electric potential of the n⁺-type semiconductor region 15 may fluctuate with respect to the electric potential of the second pad 52. For example, there is a possibility that the electric potential of the n⁺-type semiconductor region 15 may fluctuate compared to the electric potential of the n⁺-type semiconductor region 13 even when the electric potential of the second pad 52 is set to be equal to the electric potential of the first pad 51.

For this problem, according to the first embodiment, the n⁺-type semiconductor region 15 and the second interconnect 42 are electrically connected at the outer perimeter of the cell region CR. Thereby, the increase of the connection resistance between the n⁺-type semiconductor region 15 and the second interconnect 42 due to the defects can be suppressed, and the electric potential of the n⁺-type semiconductor region 15 can be stabilized more. The characteristics of the light detector 1 can be stabilized more thereby, and the reliability of the light detector 1 can be increased.

Secondary photons are generated when light is incident on the element 10. A portion of the secondary photons travels toward the adjacent elements 10. The refractive index of the separation part 20 is different from the refractive index of the element 10. Therefore, at least a portion of the secondary photons is reflected by the interface of the separation part 20. The crosstalk noise can be reduced by providing the separation part 20.

As shown in FIGS. 2 and 3, the light detector 1 includes the multiple separation parts 20 that are separated from each other. In such a case, the number of separation part 20 interfaces is greater than when one separation part 20 is located between the adjacent elements 10. By increasing the number of interfaces, the secondary photons that travel toward the adjacent elements 10 are more easily reflected. The crosstalk noise can be further reduced thereby.

When the electric potential of the second pad 52 is not fixed and is floating, a high electric field is easily applied at the vicinity of the junction surface between the p-type semiconductor region 12 and the n⁺-type semiconductor region 13 at the outer perimeter portion of the element 10 at the separation part 20 vicinity. When the nonuniformity of the electric field intensity is large between the outer perimeter portion and the central portion of the element 10, there is a possibility that the photon detection efficiency of the element 10 may be reduced. The electric field intensity at the separation part 20 vicinity can be reduced by fixing the electric potential of the second pad 52. The electric field intensity difference between the outer perimeter portion and the central portion of the element 10 can be reduced thereby. As a result, the photon detection efficiency of the element 10 can be more stably designed, and the reliability of the light detector 1 can be increased.

Figure 15:
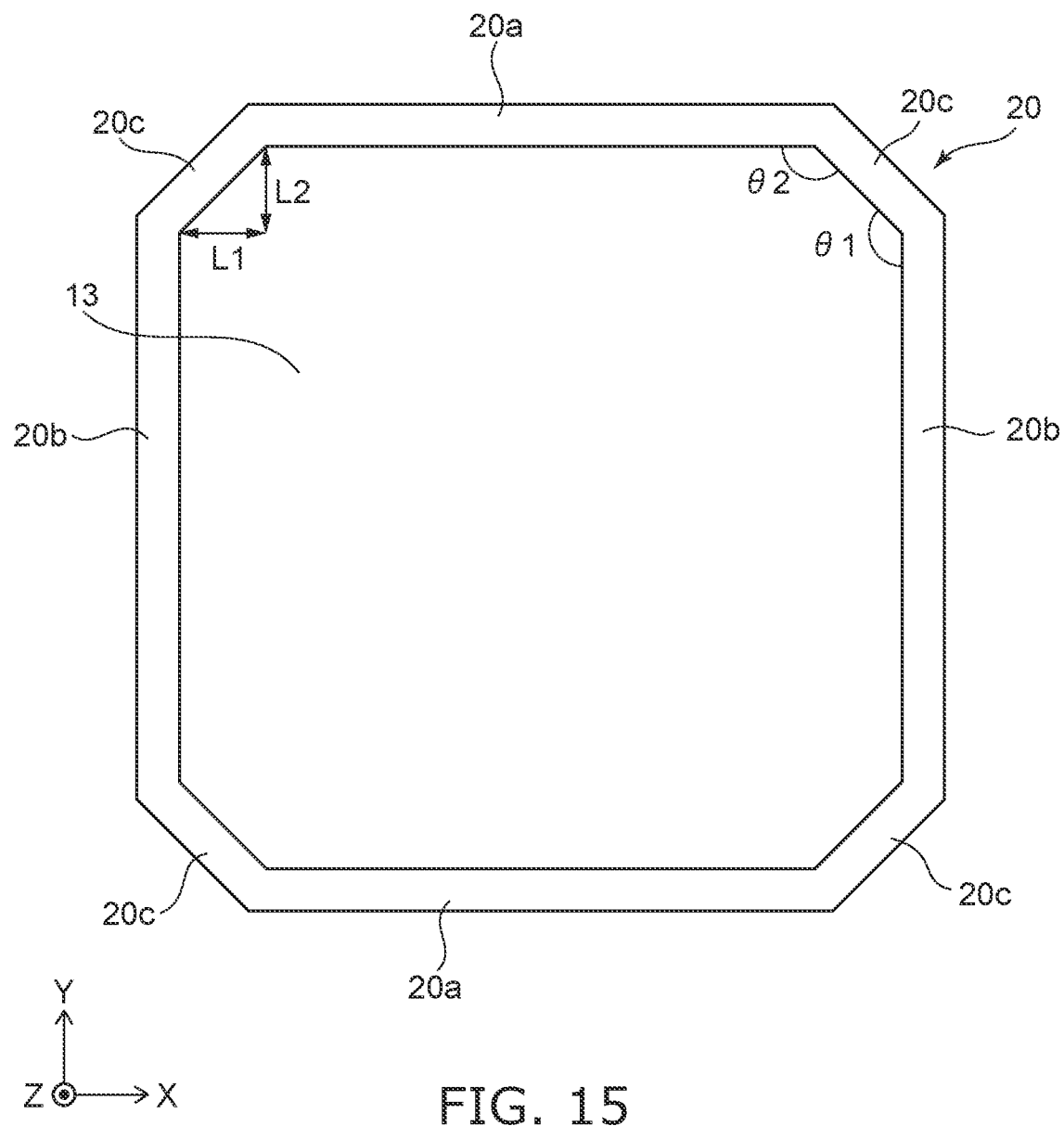
FIG. 15 is a schematic plan view illustrating a portion of the light detector according to the first embodiment.
Figure 16:
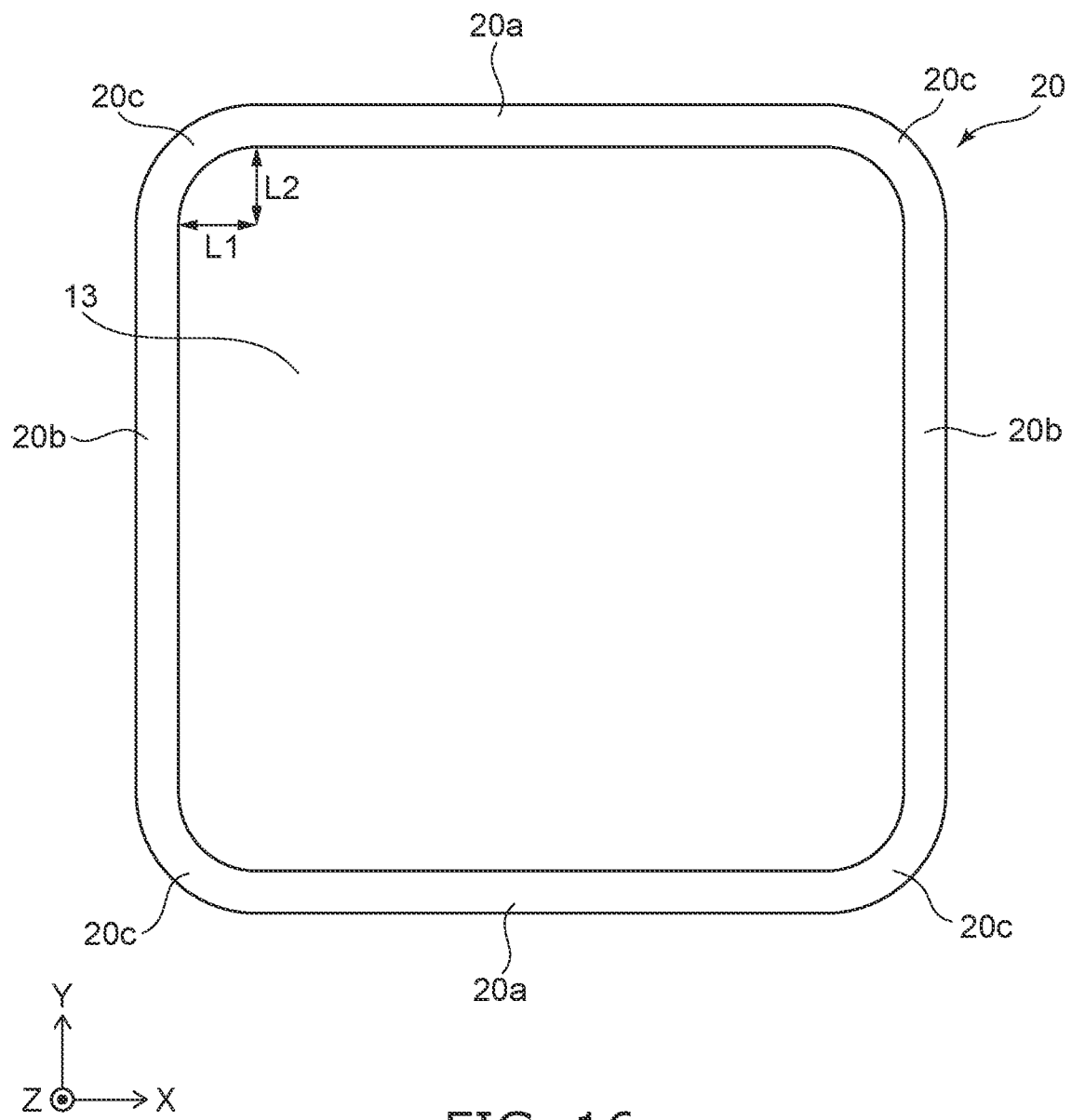
FIG. 16 is a schematic plan view illustrating a portion of the light detector according to the first embodiment.

FIGS. 15 and 16 are schematic plan views illustrating a portion of the light detector according to the first embodiment.

For example, the separation part 20 is a five-or-higher-sided polygon when viewed along the Z-direction. In the example shown in FIG. 15, the separation part 20 is an octagon when viewed along the Z-direction. Specifically, the separation part 20 includes a pair of first extension portions 20a extending along the X-direction, a pair of second extension portions 20b extending along the Y-direction, and multiple link portions 20c. The element 10 is located between the pair of first extension portions 20a in the Y-direction. The element 10 is located between the pair of second extension portions 20b in the X-direction. The link portions 20c each link one end of the first extension portion 20a and one end of the second extension portion 20b.

The length in the X-direction of the first extension portion 20a is greater than the length in the X-direction of the link portion 20c. The length in the Y-direction of the second extension portion 20b is greater than the length in the Y-direction of the link portion 20c. It is favorable for a length L1 in the X-direction of the link portion 20c and a length L2 in the Y-direction of the link portion 20c each to be not less than 1 μm. For example, the link portion 20c is a straight line when viewed along the Z-direction. It is favorable for an angle θ1 between the first extension portion 20a and the link portion 20c to be not less than 135 degrees. It is favorable for an angle θ2 between the second extension portion 20b and the link portion 20c to be not less than 135 degrees.

Or, as shown in FIG. 16, the corners of the separation part 20 may be curved when viewed along the Z-direction. In other words, the link portions 20c may be curved when viewed along the Z-direction. In the example shown in FIG. 16, the separation part 20 is a rounded quadrilateral when viewed along the Z-direction. For example, one end of the link portion 20c linked to the first extension portion 20a is along the X-direction. Another end of the link portion 20c linked to the second extension portion 20b is along the Y-direction. Thereby, the link portion 20c smoothly links the first extension portion 20a and the second extension portion 20b.

In the example shown in FIGS. 15 and 16, it is favorable for the lengths of the link portion 20c in the X-direction and the Y-direction to be not less than 1 μm. The stress that is generated at the vicinity of the link portion 20c can be effectively relaxed thereby.

Here, an example is described in which the separation part 20 includes the pair of first extension portions 20a, the pair of second extension portions 20b, and the multiple link portions 20c. It is sufficient for the separation part 20 to include at least one first extension portion 20a, one second extension portion 20b, and one link portion 20c that are connected to each other. The stress at the vicinity of the region where the one first extension portion 20a, the one second extension portion 20b, and the one link portion 20c are located can be relaxed thereby.

Second Embodiment

Figure 17:
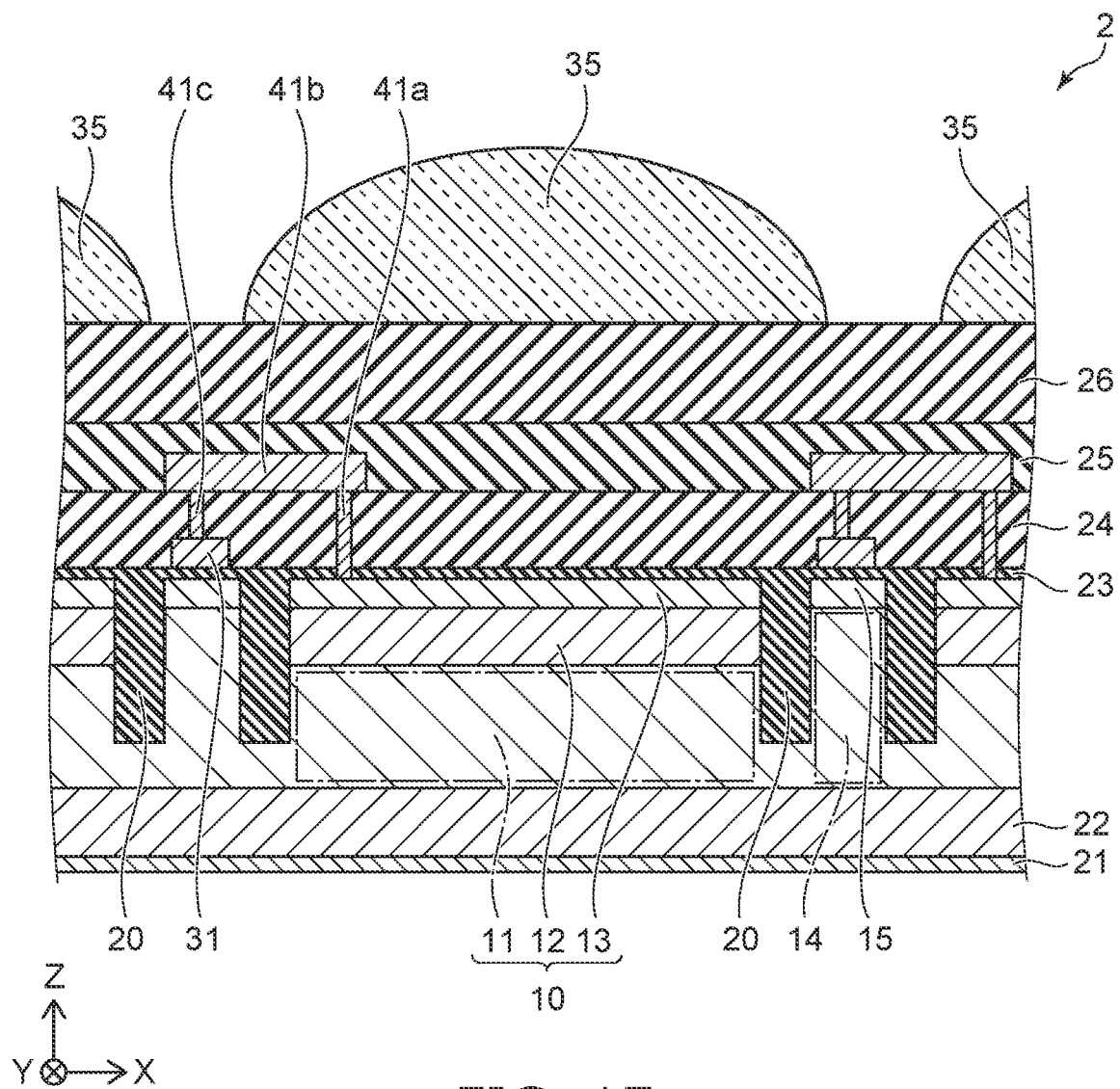
FIG. 17 is a schematic cross-sectional view illustrating a light detector according to a second embodiment.
Figure 18:
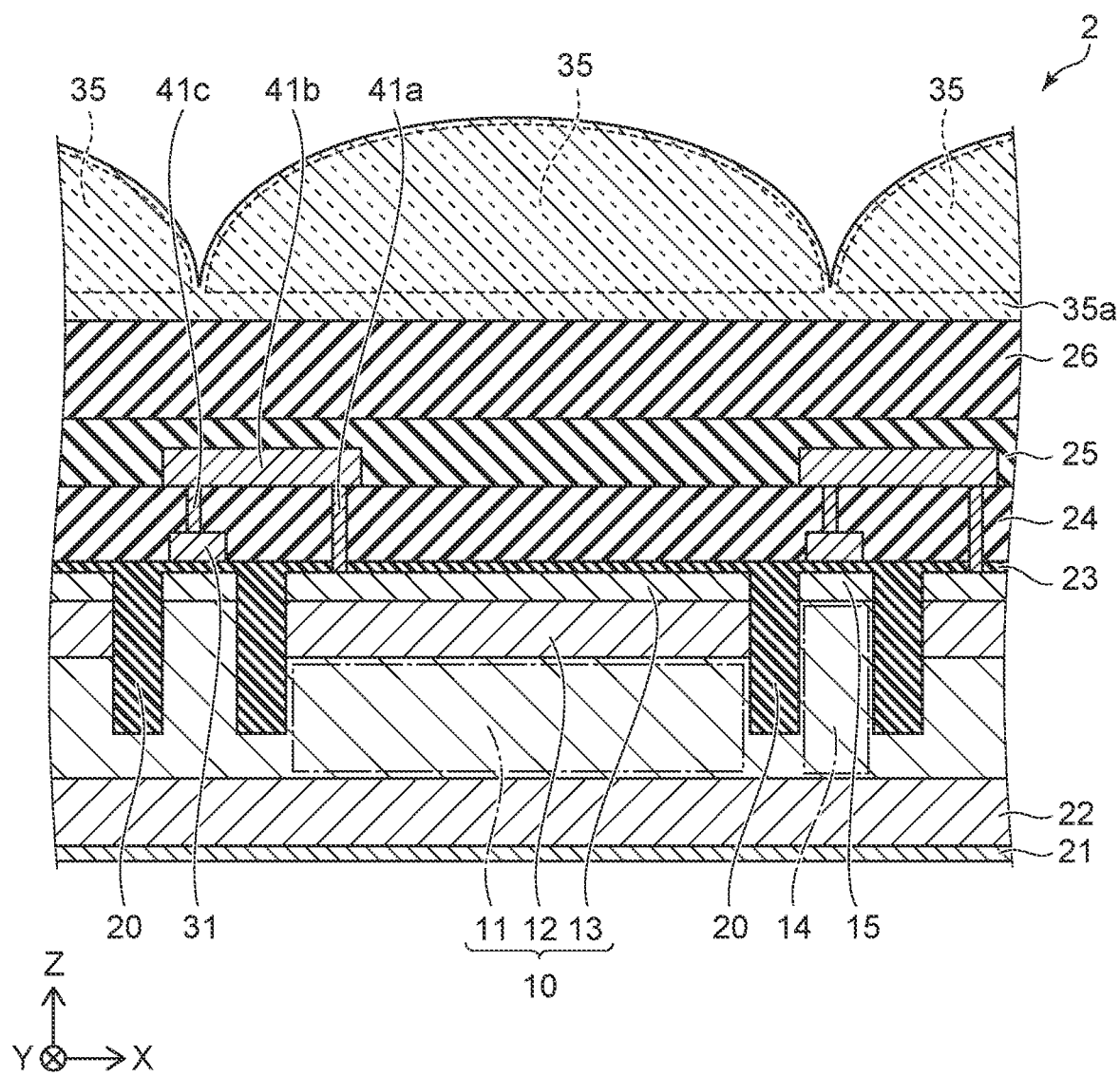
FIG. 18 is a schematic cross-sectional view illustrating the light detector according to the second embodiment.

FIGS. 17 and 18 are schematic cross-sectional views showing a light detector according to a second embodiment.

As shown in FIG. 17, compared to the light detector 1, the light detector 2 according to the second embodiment further includes a lens 35. The lens 35 is located on the planarized insulating layer 26 and is positioned on the element 10. The multiple lenses 35 are positioned respectively on the multiple elements 10. The upper surface of the lens 35 is curved to be convex. For example, the lower surface of the lens 35 is parallel to the X-Y plane.

The lens 35 includes a light-transmissive resin. It is favorable for the resin to be an acrylic resin. The acrylic resin may be a resin into which propylene glycol monomethyl ether acetate is mixed. The multiple lenses 35 may be separated from each other or may contact each other. It is favorable for the multiple lenses 35 to contact each other because the light amount that is incident on the element 10 via the lenses 35 is increased. As shown in FIG. 18, multiple protrusions may be located on the upper surface of one resin layer 35a; and the protrusions each may function as the lens 35. By providing the resin layer 35a, the focal point depth of the lens 35 can be adjusted.

By providing the lens 35, the light can be concentrated toward the element 10. In particular, when the $n^+$-type semiconductor region 15 is included and a voltage is applied between the $p^-$-type semiconductor region 14 and the $n^+$-type semiconductor region 15, there is a possibility that the area in which the carriers of the photoelectric conversion can be detected may be limited as shown in FIGS. 13A and 13B, and may be limited to an area that does not include the outer portion of the element 10. As a result, there is a possibility that the photon detection efficiency may decrease. The reduction of the photon detection efficiency due to including the $n^+$-type semiconductor region 15 can be compensated by the lens 35 concentrating the light toward the central portion of the element 10.

Third Embodiment

Figure 19:
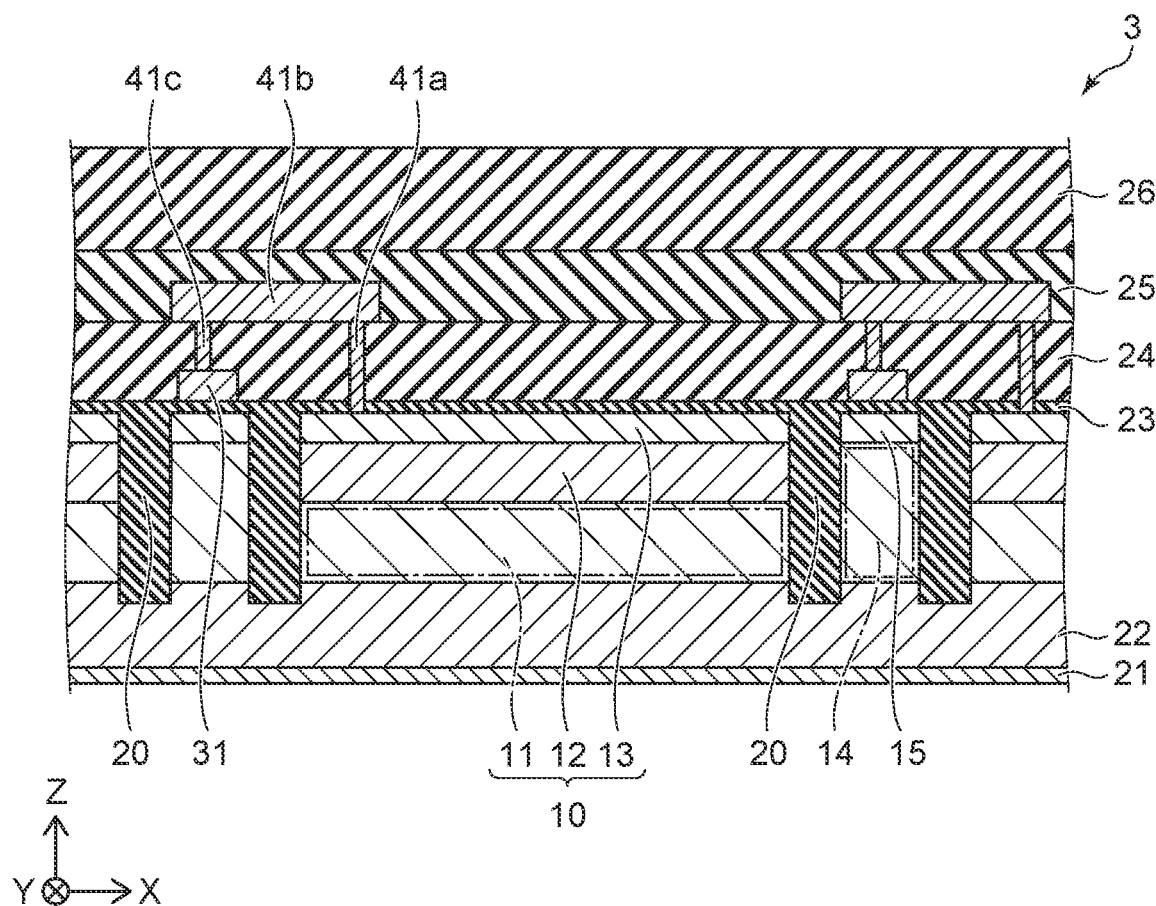
FIG. 19 is a schematic cross-sectional view illustrating a light detector according to a third embodiment.

FIG. 19 is a schematic cross-sectional view showing a light detector according to a third embodiment.

Compared to the light detector 1, the lower end of the separation part 20 contacts the semiconductor layer 22 in the light detector 3 according to the third embodiment. For example, the lower end of the separation part 20 is surrounded with the semiconductor layer 22 in the X-Y plane. The $p^-$-type semiconductor region 11 and the $p^-$-type semiconductor region 14 are separated by the separation part 20.

Generation or recombination centers exist at high density at the interface between the separation part 20 and the semiconductor region. Therefore, there is a possibility that thermally-excited carriers may cause avalanche breakdown and erroneous detection. For example, there is a possibility that the carriers generated at the lower end vicinity of the separation part 20 may reach the depletion layer DL1 and cause avalanche breakdown. On the other hand, the carrier lifetime is short because the impurity concentration of the semiconductor layer 22 is high. When the lower end of the separation part 20 contacts the semiconductor layer 22 that has a high impurity concentration, the likelihood of carriers being thermally excited at the lower end vicinity of the separation part 20, reaching the depletion layer DL1, and causing avalanche breakdown is reduced. In particular, when the $n^+$-type semiconductor region 15 is included and a voltage is applied between the $p^-$-type semiconductor region 14 and the $n^+$-type semiconductor region 15, the diffusion of the carriers from the separation part 20 vicinity of the element 10 toward the $n^+$-type semiconductor region 13 can be suppressed.

Fourth Embodiment

Figure 20:
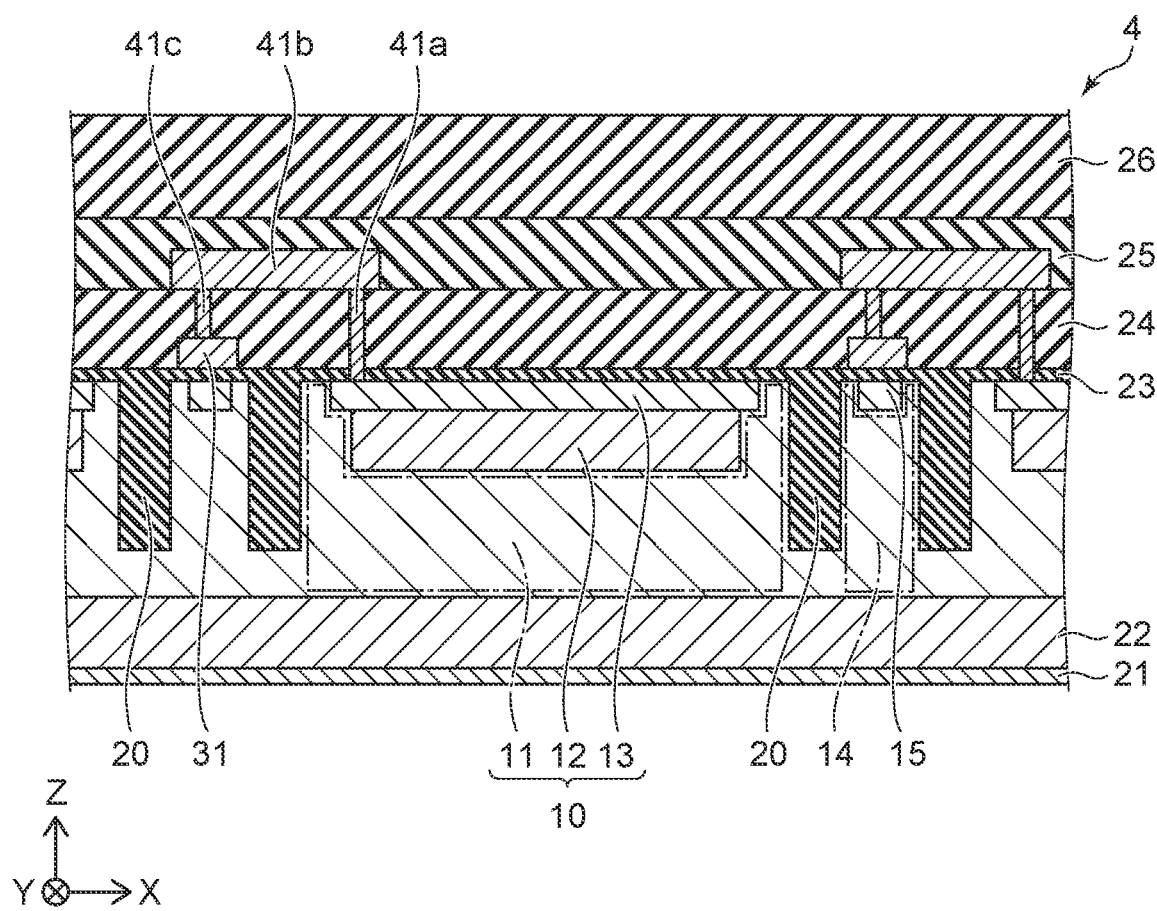
FIG. 20 is a schematic cross-sectional view illustrating a light detector according to a fourth embodiment.

FIG. 20 is a schematic cross-sectional view showing a light detector according to a fourth embodiment.

As in the light detector 4 shown in FIG. 20, the p-type semiconductor region 12 and the $n^+$-type semiconductor region 13 may be separated from the separation part 20. A portion of the $p^-$-type semiconductor region 11 is located between the p-type semiconductor region 12 and the separation part 20 and between the $n^+$-type semiconductor region 13 and the separation part 20.

When the $n^+$-type semiconductor region 13 contacts the separation part 20, the defects at the outer perimeter of the $n^+$-type semiconductor region 13 are increased by forming the first trench 106 for providing the separation part 20. The increase of the defects increases the effects of afterpulses that are output after the pulses due to the incident light. When the $n^+$-type semiconductor region 13 is separated from the separation part 20, the number of defects at the outer perimeter of the $n^+$-type semiconductor region 13 can be reduced, and the effects of the afterpulses caused by the defects can be suppressed.

Similarly, the $n^+$-type semiconductor region 15 is separated from the separation part 20. A portion of the $p^-$-type semiconductor region 14 is located between the $n^+$-type semiconductor region 15 and the separation part 20. Thereby, the $n^+$-type semiconductor region 15 can be separated from the crystal defects formed at the periphery of the separation part 20. The reliability of the light detector 4 is increased thereby.

Fifth Embodiment

Figure 21:
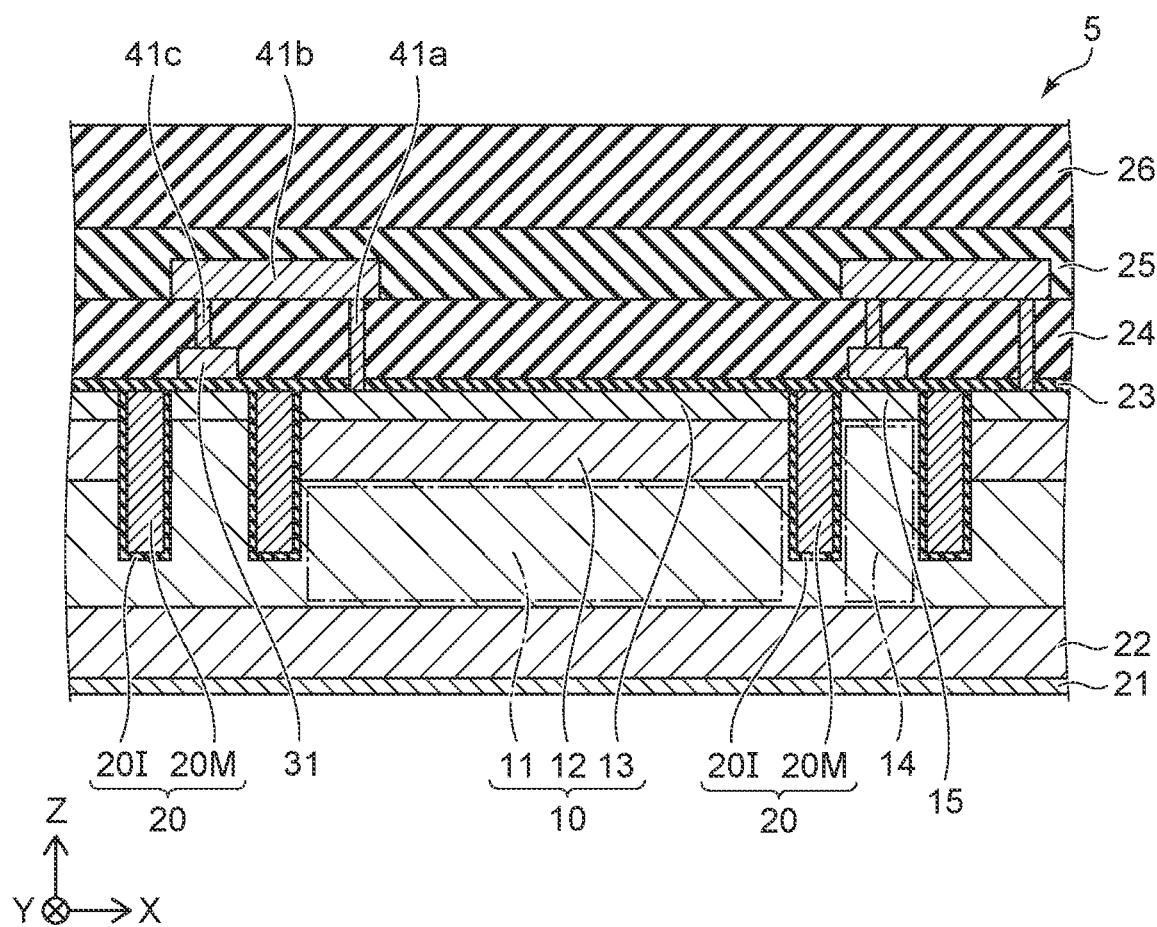
FIG. 21 is a schematic plan view illustrating a light detector according to a fifth embodiment.

FIG. 21 is a schematic plan view showing a light detector according to a fifth embodiment.

As in the light detector 5 shown in FIG. 21, the separation part 20 may include an insulating region 201 and a metal region 20M. The insulating region 201 is located between the element 10 and the metal region 20M, between the $p^-$-type semiconductor region 14 and the metal region 20M, and between the $n^+$-type semiconductor region 15 and the metal region 20M.

The metal region 20M is electrically isolated from the element 10, the $p^-$-type semiconductor region 14, and the $n^+$-type semiconductor region 15. The electric potential of the metal region 20M may be floating or fixed.

For example, the insulating region 201 includes an insulating material such as silicon oxide, silicon nitride, etc. The metal region 20M includes at least one metal selected from the group consisting of tungsten, aluminum, titanium, and copper. The metal region 20M may include a compound of a metal and silicon. The metal region 20M may include multiple metal layers. For example, the metal region 20M includes a tungsten layer, a titanium nitride layer, and a titanium layer. The titanium nitride layer is located between the tungsten layer and the insulating region 201. The titanium layer is located between the titanium nitride layer and the insulating region 201.

Compared to when the separation part 20 includes only an insulating material, the secondary photons are more easily reflected because the separation part 20 includes the metal region 20M. The crosstalk noise can be further reduced thereby.

Sixth Embodiment

Figure 22:
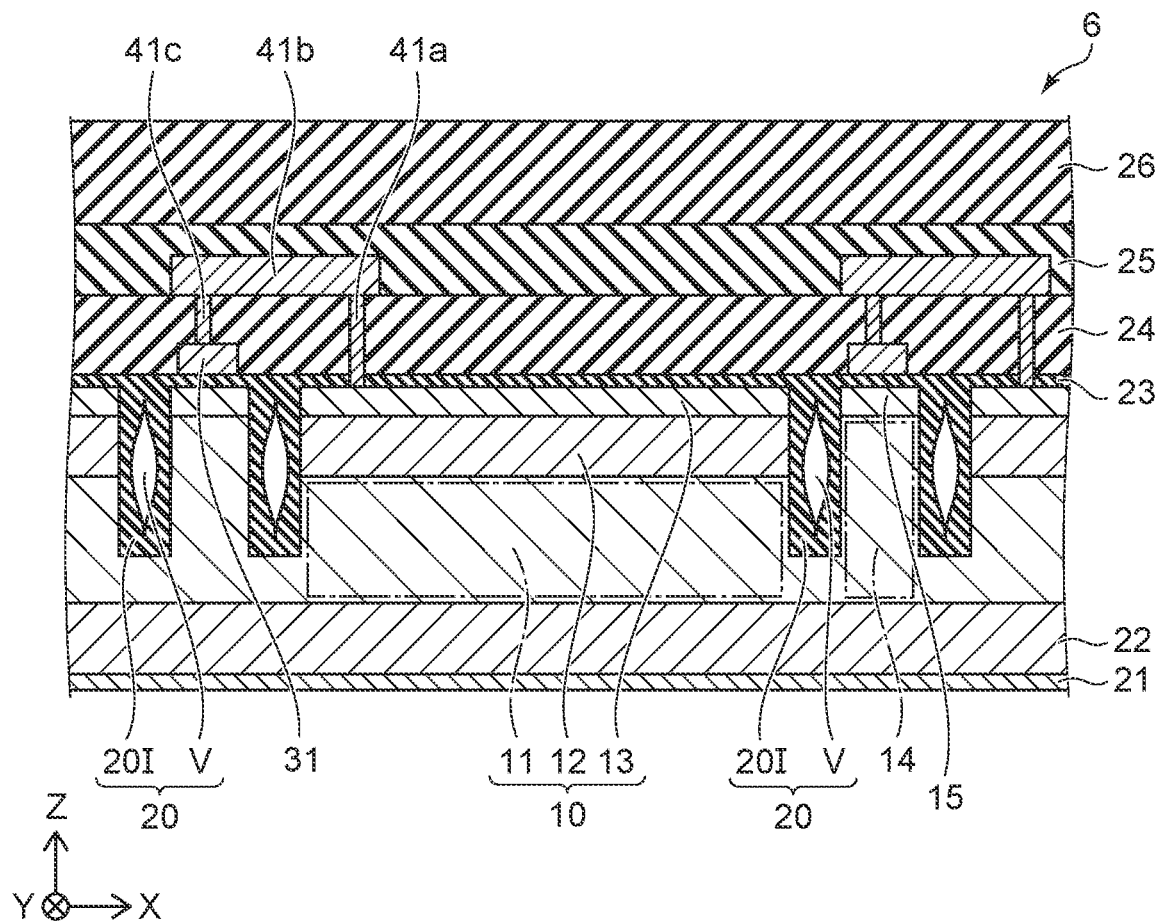
FIG. 22 is a schematic plan view illustrating a light detector according to a sixth embodiment.

FIG. 22 is a schematic plan view showing a light detector according to a sixth embodiment.

As in the light detector 6 shown in FIG. 22, the separation part 20 may include the insulating region 201 and a void V. The insulating region 201 is located between the element 10 and the void V, between the p⁻-type semiconductor region 14 and the void V, and between the n⁺-type semiconductor region 15 and the void V.

The secondary photons are reflected by the interface between the element 10 and the separation part 20 and/or the interface between the separation part 20 and the p⁻-type semiconductor region 14. According to the light detector 6, the secondary photons also are reflected by the interface between the insulating region 201 and the void V. The crosstalk noise can be further reduced thereby.

By providing the void V, the stress that is generated by the element 10, the p⁻-type semiconductor region 14, and the separation part 20 can be relaxed. For example, the occurrence of cracks, etc., when manufacturing the light detector 6 can be suppressed. The yield of the light detector 6 can be increased thereby.

Seventh Embodiment

Figure 23:
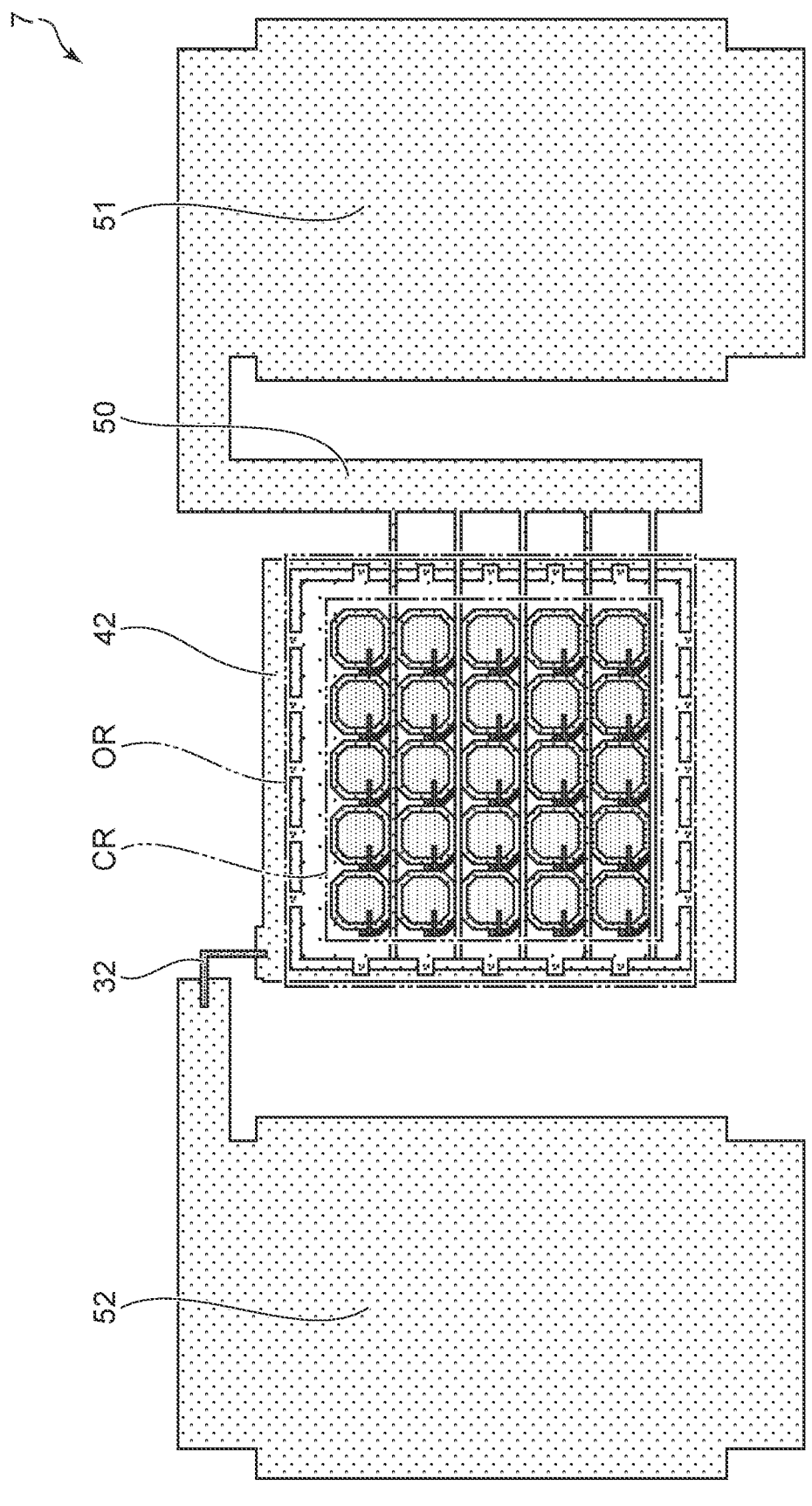
FIG. 23 is a schematic plan view illustrating a light detector according to a seventh embodiment.

FIG. 23 is a schematic plan view showing a light detector according to a seventh embodiment.

As shown in FIG. 23, the light detector 7 according to the seventh embodiment differs from the light detector 1 in that a second quenching part 32 is further included. The second quenching part 32 is electrically connected to the second interconnect 42. In the example of FIG. 23, the second quenching part 32 is located between the second interconnect 42 and the second pad 52 and is electrically connected to the second interconnect 42 and the second pad 52.

The second quenching part 32 may be a resistor that generates a large voltage drop, or may include an active quenching circuit. When the electric potential of the second pad 52 is set to be equal to the electric potential of the first pad 51, the second quenching part 32 is included to adjust the surface electric potential of the n⁺-type semiconductor region 15. For example, when the second quenching part 32 is a resistor that generates a large voltage drop, the electric current amount that flows between the p⁻-type semiconductor region 14 and the n⁺-type semiconductor region 15 can be reduced. As a result, the Geiger mode operation of the element 10 can be more stable while fixing the surface electric potential of the n⁺-type semiconductor region 15; and the reliability of the light detector 7 can be increased.

Eighth Embodiment

Figure 24:
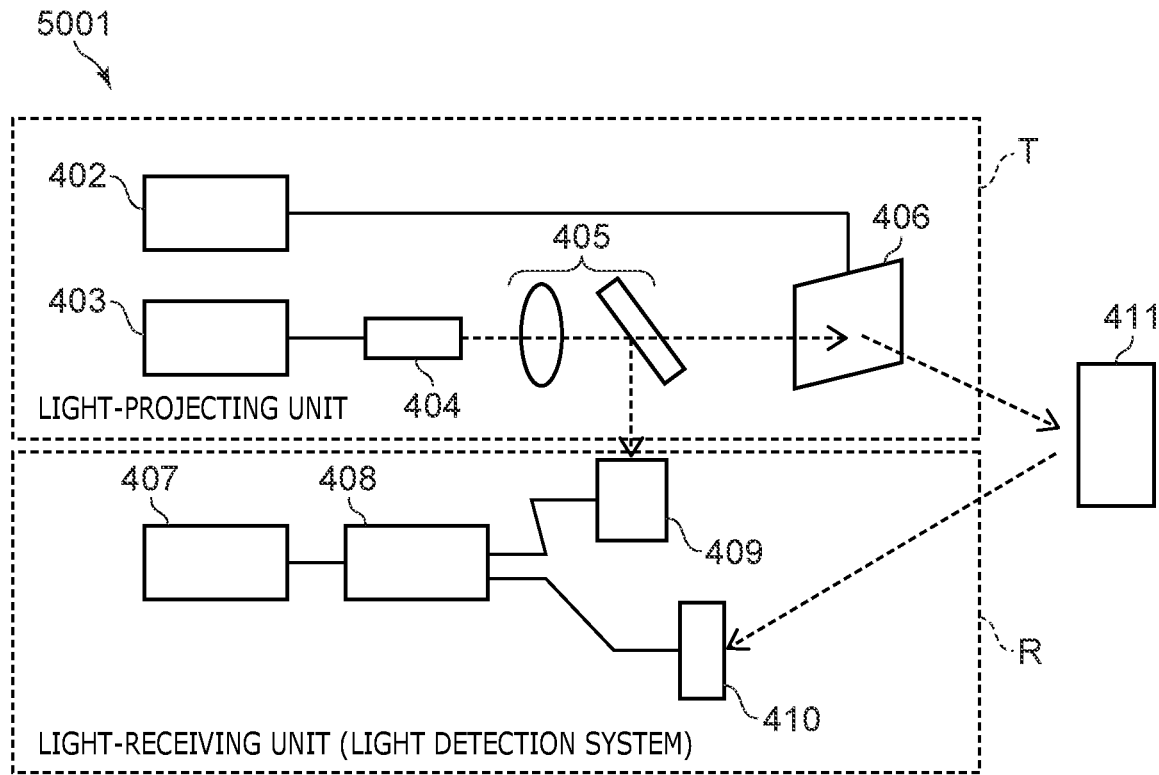
FIG. 24 is a schematic view illustrating a lidar (Laser Imaging Detection and Ranging (LIDAR)) device according to an eighth embodiment.

FIG. 24 is a schematic view illustrating a lidar (Laser Imaging Detection and Ranging (LIDAR)) device according to an eighth embodiment.

The embodiment is applicable to a long-distance subject detection system (LIDAR) or the like including a line light source and a lens. The lidar device 5001 includes a light-projecting unit T projecting laser light toward an object 411, and a light-receiving unit R (also called a light detection system) receiving the laser light from the object 411, measuring the time of the round trip of the laser light to and from the object 411, and converting the time into a distance.

In the light-projecting unit T, a light source 404 emits light. For example, the light source 404 includes a laser light oscillator and produces laser light. A drive circuit 403 drives the laser light oscillator. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light-receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band that is invisible to humans. For example, the lidar device 5001 can be used for obstacle detection for a mobile body.

Figure 25:
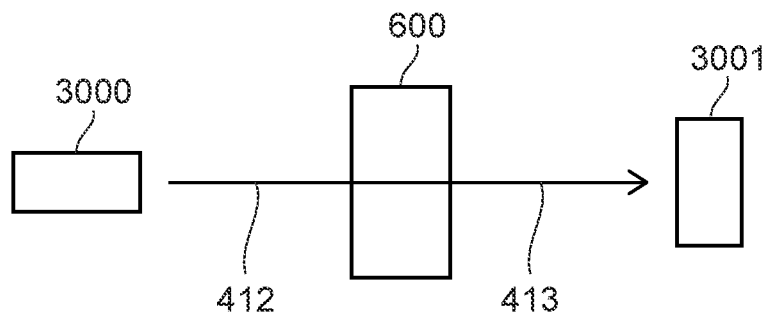
FIG. 25 describes the detection of the detection object of the lidar device.

FIG. 25 describes the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 can realize highly-sensitive detection when the light detector according to the embodiment described above is used. It is favorable to provide multiple sets of the light detectors 410 and the light source 404 and to preset the arrangement relationship of the sets in the software (which is replaceable with a circuit). For example, it is favorable for the arrangement relationship of the sets of the light detector 410 and the light source 404 to be provided at uniform spacing. Thereby, an accurate three-dimensional image can be generated by the output signals of each light detector 410 complementing each other.

Figure 26:
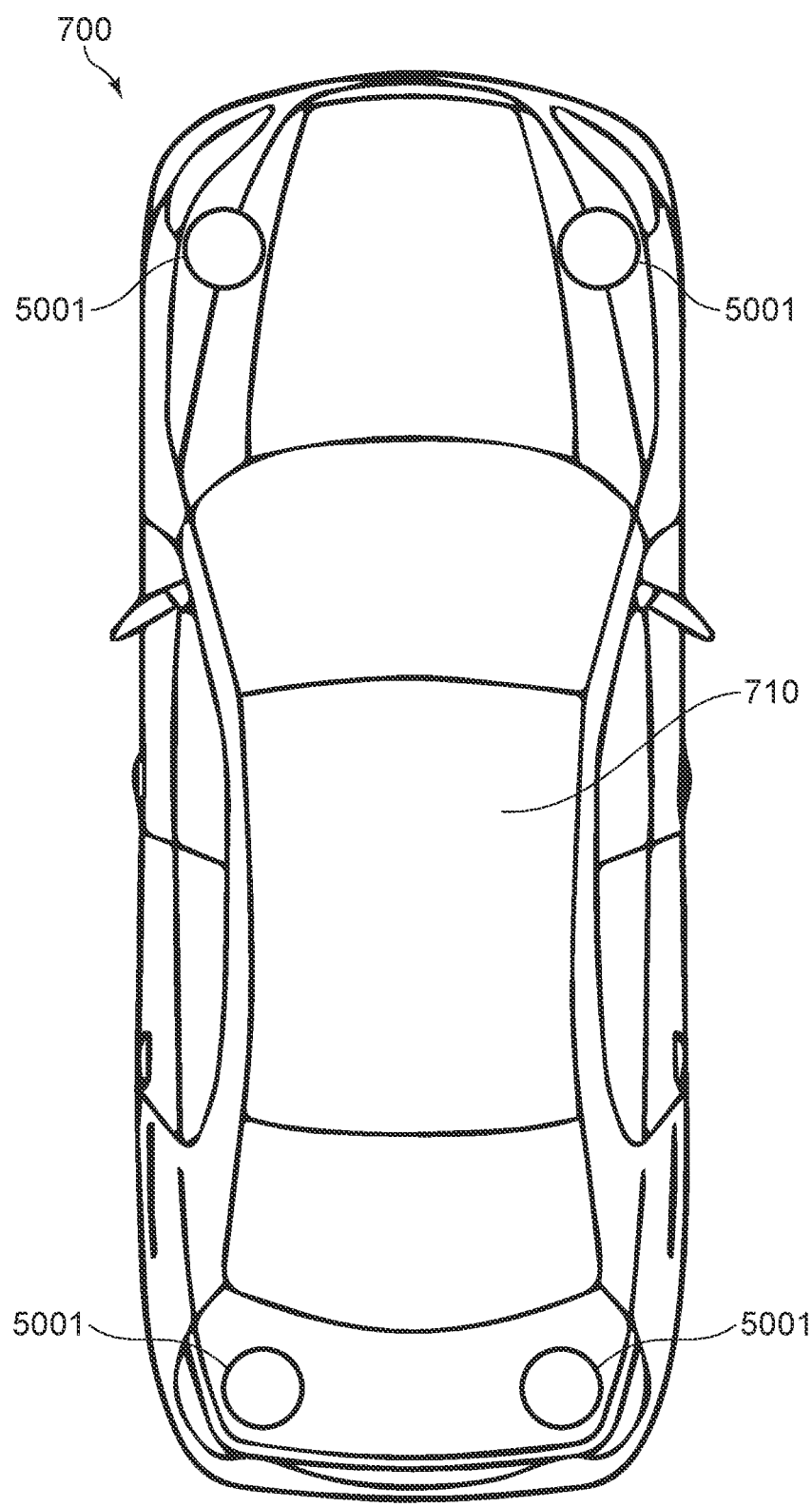
FIG. 26 is a schematic top view of a mobile body including the lidar device according to the eighth embodiment.

FIG. 26 is a schematic top view of a mobile body including the lidar device according to the eighth embodiment.

In the example of FIG. 26, the mobile body is a vehicle. A vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

Other than the vehicle illustrated in FIG. 26, the mobile body may be a drone, a robot, etc. The robot is, for example, an automatic guided vehicle (AGV). By including the lidar devices at the four corners of such mobile bodies, the environment in all directions of the mobile body can be detected by the lidar devices.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components such as $p^-$-type semiconductor regions, p-type semiconductor regions, $n^+$-type semiconductor regions, separation parts, electrodes, semiconductor layers, insulating layers, quenching parts, lenses, interconnects, plugs, pads, cell regions, outer perimeter regions, etc., included in light detectors are included in the scope of the invention to the extent that the purport of the invention is included.

Furthermore, any two or more components of the specific examples may be combined within the extent of technical feasibility, and are included in the scope of the invention to the extent that the purport of the invention is included.

Moreover, all light detectors, light detection systems, lidar devices, and mobile bodies practicable by an appropriate design modification by one skilled in the art based on the light detectors, the light detection systems, the lidar devices, and the mobile bodies described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:
a plurality of elements located in a cell region and arranged along a first direction and a second direction, the second direction crossing the first direction, each of the elements including
a first semiconductor region of a first conductivity type,
a second semiconductor region located on the first semiconductor region, the second semiconductor region being of the first conductivity type and including a higher first-conductivity-type impurity concentration than the first semiconductor region, and
a third semiconductor region located on the second semiconductor region, the third semiconductor region being of a second conductivity type;
a plurality of separation parts located respectively around the elements in a first plane parallel to the first and second directions;
a fourth semiconductor region located around each of the separation parts in the first plane, the fourth semiconductor region being of the first conductivity type;
a fifth semiconductor region located on the fourth semiconductor region, the fifth semiconductor region being of the second conductivity type;
a first interconnect electrically connected to at least a portion of the third semiconductor regions;
a first quenching part electrically connected to the first interconnect; and
a second interconnect electrically connected to the fifth semiconductor region at a periphery of the cell region.

2. The detector according to claim 1, further comprising:
an insulating layer located on the elements, the separation parts, and the fifth semiconductor region; and
a plurality of lenses located on the insulating layer and positioned respectively on the elements.

3. The detector according to claim 1, wherein
the second semiconductor region and the third semiconductor region of one of the elements are separated from one of the separation parts located around the one of the elements.

4. The detector according to claim 1, further comprising:
an electrode; and
a semiconductor layer located on the electrode, the semiconductor layer being of the first conductivity type,
the elements, the separation parts, and the fourth semiconductor region being located on the semiconductor layer.

5. The detector according to claim 4, wherein
a lower end of at least one of the separation parts contacts the semiconductor layer.

6. The detector according to claim 1, wherein
at least one of the separation parts is a rounded quadrilateral or a polygon of at least five sides when viewed along a third direction perpendicular to the first and second directions.

7. The detector according to claim 1, wherein
at least one of the separation parts is an octagon when viewed along a third direction perpendicular to the first and second directions.

8. The detector according to claim 1, further comprising:
a first pad electrically connected to the first interconnect; and
a second pad separated from the first pad and electrically connected to the second interconnect.

9. The detector according to claim 1, further comprising:
a second quenching part electrically connected to the second interconnect.

10. The detector according to claim 1, wherein
a first-conductivity-type impurity concentration in the fourth semiconductor region is less than the first-conductivity-type impurity concentration in the second semiconductor region.

11. The detector according to claim 1, wherein
at least one of the elements is an avalanche photodiode.

12. The detector according to claim 1, wherein
at least one of the elements operates in a Geiger mode.

13. A light detection system, comprising:
the light detector according to claim 1; and
a distance measuring circuit calculating a time-of-flight of light by using an output signal of the light detector.

14. A lidar device, comprising:
a light source irradiating light on an object; and
the light detection system according to claim 13 detecting light reflected by the object.

15. The device according to claim 14, further comprising:
- an image recognition system generating a three-dimensional image based on an arrangement relationship of the light source and the light detector.

16. A mobile body, comprising:
- the lidar device according to claim 14.

* * * * *